(12) United States Patent
Feng et al.

(10) Patent No.: US 11,410,608 B2
(45) Date of Patent: Aug. 9, 2022

(54) SHIFT REGISTER CIRCUITRY, GATE DRIVING CIRCUIT, DISPLAY DEVICE, AND DRIVING METHOD THEREOF

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN); Can Yuan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 85 days.

(21) Appl. No.: 16/652,165

(22) PCT Filed: Oct. 22, 2019

(86) PCT No.: PCT/CN2019/112498
§ 371 (c)(1),
(2) Date: Mar. 30, 2020

(87) PCT Pub. No.: WO2020/083275
PCT Pub. Date: Apr. 30, 2020

(65) Prior Publication Data
US 2021/0201803 A1    Jul. 1, 2021

(30) Foreign Application Priority Data
Oct. 25, 2018   (CN) .......... 201811246431.0

(51) Int. Cl.
G09G 3/3266   (2016.01)
G09G 3/3225   (2016.01)
G11C 19/28    (2006.01)

(52) U.S. Cl.
CPC ......... *G09G 3/3266* (2013.01); *G09G 3/3225* (2013.01); *G11C 19/28* (2013.01);
(Continued)

(58) Field of Classification Search
CPC ..... G09G 3/3266; G09G 3/3225; G11C 19/28
See application file for complete search history.

(56) References Cited

U.S. PATENT DOCUMENTS

2005/0225519 A1* 10/2005 Naugler ............... G09G 3/3233
                                                        345/77
2005/0248515 A1* 11/2005 Naugler ............... G09G 3/3233
                                                        345/77

(Continued)

FOREIGN PATENT DOCUMENTS

CN   101089939 A   12/2007
CN   103065578 A    4/2013

(Continued)

OTHER PUBLICATIONS

PCT International Search Report, Application No. PCT/CN2019/112498, dated Jan. 8, 2020, 6 pages: with English translation.

(Continued)

*Primary Examiner* — Fred Tzeng
(74) *Attorney, Agent, or Firm* — Armstrong Teasdale LLP

(57) ABSTRACT

Embodiments of the present disclosure provide a shift register circuitry, a gate driving circuit, a display device, and a driving method. The shift register circuitry includes a blanking input circuit, a display input circuit, an output circuit, and a first control circuit. The blanking input circuit provides a blanking input signal to the pull-up control node and supplies a blanking pull-up signal to the pull-up node. The display input circuit provides a display pull-up signal to the pull-up node in response to the display input signal. The (Continued)

output circuit outputs the output signal to the shift signal output terminal and the pixel signal output terminal under the control of the voltage of the pull-up node. The first control circuit couples the shift signal output terminal to the pixel signal output terminal in response to the display input signal.

19 Claims, 9 Drawing Sheets

(52) U.S. Cl.
CPC .............. *G09G 2300/0421* (2013.01); *G09G 2310/0286* (2013.01); *G09G 2310/08* (2013.01)

(56) References Cited

U.S. PATENT DOCUMENTS

2017/0372654 A1* 12/2017 So ..................... G09G 3/3266
2020/0035317 A1* 1/2020 Feng .................. G11C 19/287

FOREIGN PATENT DOCUMENTS

| CN | 105225630 | A | 1/2016 |
| CN | 107452312 | A | 12/2017 |
| CN | 108648716 | A | 10/2018 |
| CN | 108648718 | A | 10/2018 |
| CN | 108682397 | A | 10/2018 |
| CN | 108682398 | A | 10/2018 |
| CN | 109920379 | A | 6/2019 |

OTHER PUBLICATIONS

PCT Written Opinion, Application No. PCT/CN2019/112498, dated Jan. 8, 2020, 6 pages.: with English translation of relevant part.
China First Office Action, Application No. 201811246431.0, dated Mar. 16, 2020, 28 pps.: with English translation.

* cited by examiner

SHIFT REGISTER CIRCUITRY, GATE DRIVING CIRCUIT, DISPLAY DEVICE, AND DRIVING METHOD THEREOF

CROSS REFERENCE TO RELATED APPLICATIONS

This patent application is a National Stage Entry of PCT/CN2019/112498 filed on Oct. 22, 2019, which claims the benefit and priority of Chinese Patent Application No. 201811246431.0 filed on Oct. 25, 2018, the disclosures of which are incorporated by reference herein in their entirety as part of the present application.

BACKGROUND

The present disclosure relates to the field of display technologies, and in particular, to a shift register circuitry, a gate driving circuit, a display device, and a driving method thereof.

With the development of display technology, compared with traditional Liquid Crystal Display (LCD) devices, a new generation of Organic Light Emitting Diode (OLED) display devices has advantages, such as, lower manufacturing costs, faster response speeds, higher contrast, wider viewing angle, larger operating temperature range, no need for a backlight unit, colorful and thin, and the like. Therefore, the OLED display technology has become a fastest growing display technology.

In order to improve process integration of an OLED display panel and reduce costs, a gate driving circuit with thin film transistors (TFTs) is usually integrated on an array substrate of the display panel by using Gate Driver on Array (GOA) technology, thereby performing scan driving for the display panel. Such gate driving circuit integrated on the array substrate using GOA technology can also be called a GOA unit or a shift register circuitry. Since the display device using the GOA circuit eliminates the need of binding a driving circuit, the cost can be reduced in terms of material costs and manufacturing processes.

BRIEF DESCRIPTION

Embodiments of the present disclosure provide a shift register and a driving method thereof, a gate driving circuit and a driving method thereof, and a display device.

A first aspect of the present disclosure provides a shift register circuitry. The shift register circuitry includes a blanking input circuit, a display input circuit, an output circuit, and a first control circuit. The blanking input circuit is configured to provide a blanking input signal to a pull-up control node and provide a blanking pull-up signal to a pull-up node. The display input circuit is configured to provide a display pull-up signal to the pull-up node according to a display input signal. The output circuit is configured to provide an output signal to a shift signal output terminal and a pixel signal output terminal according to a voltage of the pull-up node. The first control circuit is configured to couple the shift signal output terminal to the pixel signal output terminal according to the display input signal.

In an embodiment of the present disclosure, the first control circuit includes a first transistor. A control electrode of the first transistor is coupled to a display input signal terminal to receive the display input signal, a first electrode of the first transistor is coupled to the shift signal output terminal, and a second electrode of the first transistor is coupled to the pixel signal output terminal.

In an embodiment of the present disclosure, the shift register circuitry further includes a second control circuit. The second control circuit is configured to couple the shift signal output terminal to the pixel signal output terminal according to a first clock signal.

In an embodiment of the present disclosure, the second control circuit includes a second transistor. A control electrode of the second transistor is coupled to a first clock signal terminal to receive the first clock signal, a first electrode of the second transistor is coupled to the shift signal output terminal, and a second electrode of the second transistor is coupled to the pixel signal output terminal.

In an embodiment of the present disclosure, the blanking input circuit includes a charging sub-circuit, a storage sub-circuit, and an isolation sub-circuit. The charging sub-circuit is configured to provide the blanking input signal to the pull-up control node according to a second clock signal. The storage sub-circuit is configured to store the blanking input signal from the charging sub-circuit. The isolation sub-circuit is configured to provide the blanking pull-up signal to the pull-up node according to a voltage of the pull-up control node and a first clock signal.

In the embodiment of the present disclosure, the charging sub-circuit includes a third transistor. A control electrode of the third transistor is coupled to a second clock signal terminal to receive the second clock signal, a first electrode of the third transistor is coupled to the blanking input signal terminal to receive the blanking input signal, and the second electrode of the third transistor is coupled to the pull-up control node. The storage sub-circuit includes a first capacitor, wherein a first end of the first capacitor is coupled to the pull-up control node, and a second end of the first capacitor is coupled to a first voltage terminal to receive a first voltage. The isolation sub-circuit includes a fourth transistor and a fifth transistor, wherein a control electrode of the fourth transistor is coupled to the pull-up control node, a first electrode of the fourth transistor is coupled to a third clock signal terminal to receive a third clock signal as the blanking pull-up signal, a second electrode of the fourth transistor is coupled to a first electrode of the fifth transistor, a control electrode of the fifth transistor is coupled to a first clock signal terminal to receive the first clock signal, and a second electrode of the fifth transistor is coupled to the pull-up node.

In an embodiment of the present disclosure, the display input circuit includes a sixth transistor. A control electrode of the sixth transistor is coupled to a display input signal terminal to receive the display input signal, a first electrode of the sixth transistor is coupled to a second voltage terminal to receive a second voltage as the display pull-up signal, and a second electrode of the sixth transistor is coupled to the pull-up node.

In an embodiment of the present disclosure, the output circuit includes a seventh transistor, an eighth transistor, and a second capacitor. A control electrode of the seventh transistor is coupled to the pull-up node, a first electrode of the seventh transistor is coupled to a fourth clock signal terminal to receive a fourth clock signal as the output signal, and a second electrode of the transistor is coupled to the shift signal output terminal. A control electrode of the eighth transistor is coupled to the pull-up node, a first electrode of the eighth transistor is coupled to the fourth clock signal terminal to receive the fourth clock signal as the output signal, and a second electrode of the eighth transistor is coupled to the pixel signal output terminal. A first end of the second capacitor is coupled to the pull-up node, and a second end of the second capacitor is coupled to the second electrode of the seventh transistor.

In the embodiment of the present disclosure, the shift register circuitry further includes a pull-down circuit, a first pull-down control circuit, a second pull-down control circuit, and a reset circuit. The pull-down circuit is configured to perform noise reduction on the pull-up node, the shift signal output terminal, and the pixel signal output terminal according to a voltage of the pull-down node. The first pull-down control circuit is configured to control the voltage of the pull-down node according to the voltage of the pull-up node. The second pull-down control circuit is configured to control the voltage of the pull-down node according to a blanking pull-down control signal and a display pull-down control signal. The reset circuit is configured to reset the voltage of the pull-up node according to a blanking reset signal and a display reset signal.

In an embodiment of the present disclosure, the pull-down circuit includes a ninth transistor, a tenth transistor, and an eleventh transistor. A control electrode of the ninth transistor is coupled to the pull-down node, a first electrode of the ninth transistor is coupled to the pull-up node, and a second electrode of the ninth transistor is coupled to a first voltage terminal to receive a first voltage. A control electrode of the tenth transistor is coupled to the pull-down node, a first electrode of the tenth transistor is coupled to the shift signal output terminal, and a second electrode of the tenth transistor is coupled to the first voltage terminal to receive the first voltage. A control electrode of the eleventh transistor is coupled to the pull-down node, a first electrode of the eleventh transistor is coupled to the pixel signal output terminal, and a second electrode of the eleventh transistor is coupled to a third voltage terminal to receive a third voltage.

In an embodiment of the present disclosure, the first pull-down control circuit includes a twelfth transistor, a thirteenth transistor, and a fourteenth transistor. A control electrode and a first electrode of the twelfth transistor are coupled to a fourth voltage terminal to receive a fourth voltage, and a second electrode of the twelfth transistor is coupled to the pull-down node. A control electrode and a first electrode of the thirteenth transistor are coupled to a fifth voltage terminal to receive a fifth voltage, and a second electrode of the thirteenth transistor is coupled to the pull-down node. A control electrode of the fourteenth transistor is coupled to the pull-up node, a first electrode of the fourteenth transistor is coupled to the pull-down node, and a second electrode of the fourteenth transistor is coupled to a first voltage terminal to receive a first voltage.

In an embodiment of the present disclosure, the second pull-down control circuit includes a fifteenth transistor and a sixteenth transistor. A control electrode of the fifteenth transistor is coupled to a first clock signal terminal to receive the first clock signal as the blanking pull-down control signal, a first electrode of the fifteenth transistor is coupled to the pull-down node, and a second electrode of the fifteenth transistor is coupled to the first voltage terminal to receive the first voltage. A control electrode of the sixteenth transistor is coupled to a display input signal terminal to receive the display input signal as the display pull-down control signal, a first electrode of the sixteenth transistor is coupled to the pull-down node, and a second electrode of the sixteenth transistor is coupled to the first voltage terminal to receive the first voltage.

In an embodiment of the present disclosure, the reset circuit includes a seventeenth transistor and an eighteenth transistor. A control electrode of the seventeenth transistor is coupled to a second clock signal terminal to receive a second clock signal as the blanking reset signal, a first electrode of the seventeenth transistor is coupled to the pull-up node, and a second electrode of the seventeenth transistor is coupled to the first voltage terminal to receive the first voltage. A control electrode of the eighteenth transistor is coupled to a display reset signal terminal to receive the display reset signal, a first electrode of the eighteenth transistor is coupled to the pull-up node, and a second electrode of the eighteenth transistor is coupled to the first voltage terminal to receive the first voltage.

In an embodiment of the present disclosure, the shift register circuitry further includes a load capacitor and a load resister. An end of the load capacitor is coupled to the pixel signal output terminal, and the other end of the load capacitor is grounded. An end of the load resistor is coupled to the pixel signal output terminal, and the other end of the load resistor is grounded.

A second aspect of the present disclosure provides a gate driving circuit. The gate driving circuit includes a plurality of cascaded shift register circuitries in the first aspect of the present disclosure. A shift signal output terminal of the shift register circuitry at the $n^{th}$ stage provides a blanking input signal to the shift register circuitry at the $(n+1)^{th}$ stage. A shift signal output terminal of the shift register circuitry at the $n^{th}$ stage provides a display input signal to the shift register circuitry at the $(n+2)^{th}$ stage. N is an integer greater than 0.

In an embodiment of the present disclosure, the gate driving circuit further includes a first sub-clock signal line, a second sub-clock signal line, a third sub-clock signal line, and a fourth sub-clock signal line. The first sub-clock signal line provides a fourth clock signal to the shift register circuitry at the $(4i-3)^{th}$ stage as an output signal. The second sub-clock signal line providing a fourth clock signal to the shift register circuitry at the $(4i-2)^{th}$ stage as an output signal. The third sub-clock signal line provides a fourth clock signal to the shift register circuitry at the $(4i-1)^{th}$ stage as an output signal. The fourth sub-clock signal line provides a fourth clock signal to the shift register circuitry at the $4i^{th}$ stage as an output signal.

In an embodiment of the present disclosure, the gate driving circuit further includes a fifth sub-clock signal line, a sixth sub-clock signal line, and a seventh sub-clock signal line. The fifth sub-clock signal line provides a second clock signal to the shift register circuitry at the $(2n-1)^{th}$ stage and provides a third clock signal to the shift register circuitry at the $2n^{th}$ stage, as a blanking pull-up signal. The sixth sub-clock signal line provides a third clock signal to the shift register circuitry at the $(2n-1)^{th}$ stage as a blanking pull-up signal, and provides a second clock signal to the shift register circuitry at the $2n^{th}$ stage. The seventh sub-clock signal line provides a first clock signal to the respective shift register circuitries.

In the embodiment of the present disclosure, the shift signal output terminal of the stage shift register circuitry at the $(n+3)^{th}$ provides a display reset signal to the stage shift register circuitry at the $n^{th}$ stage.

A third aspect of the present disclosure provides a display device. The display device includes a gate driving circuit in the second aspect of the present disclosure.

A fourth aspect of the present disclosure provides a method for driving a shift register circuitry in the first aspect of the present disclosure. The method includes providing, by a blanking input circuit, a blanking input signal to a pull-up control node, providing, by a display input circuit, a display pull-up signal to a pull-up node according to the display input signal, wherein a shift signal output terminal is coupled to a pixel signal output terminal by a first control circuit according to the display input signal, outputting, by an output circuit, a display output signal according to a voltage of the pull-up node, providing, by a blanking input circuit, a blanking pull-up signal to the pull-up node according to a voltage of the pull-up control node and a first clock signal, and outputting, by the output circuit, a blanking output signal according to the voltage of the pull-up node.

In an embodiment of the present disclosure, the method further includes coupling, by the second control circuit, the shift signal output terminal to the pixel signal output terminal according to the first clock signal.

BRIEF DESCRIPTION OF THE DRAWINGS

In order to illustrate the technical solutions of the present disclosure more clearly, the drawings of the embodiments will be briefly described below. It can be understood that the drawings described below are only related to some of the embodiments of the present disclosure, rather than limiting the present disclosure, in which.

DETAILED DESCRIPTION

Figure 1:
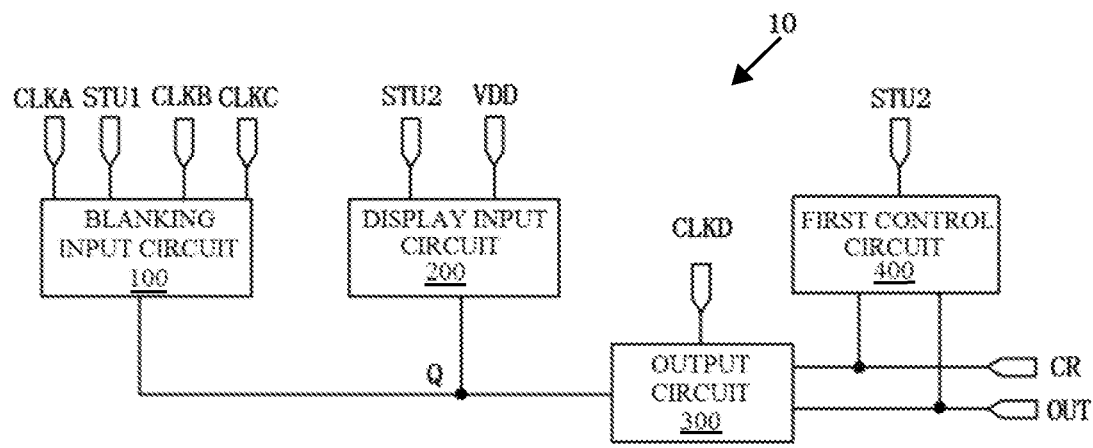
FIG. 1 illustrates a schematic block diagram of a shift register circuitry according to an embodiment of the present disclosure.

In order to make the technical solutions and advantages of the embodiments of the present disclosure clearer, the technical solutions of the embodiments of the present disclosure will be clearly and completely described below in conjunction with the accompanying drawings. Obviously, the described embodiments are merely part of the embodiments of the present disclosure, rather than all of the embodiments. According to the described embodiments, all the other embodiments obtained by those of ordinary skill in the art without creative labor also fall within the scope of protection of the present disclosure.

Unless otherwise stated, the technical or scientific terms used in the present disclosure shall have the ordinary meanings understood by those having ordinary skills in the art to which the present disclosure belongs. The terms "first", "second", and the like used in the present disclosure do not indicate any order, quantity, or importance, but are only used to distinguish different components. Similarly, "a", "an", or "the" and the like do not indicate a limit on quantity, but rather indicate that there is at least one. Words such as "including" or "comprising" mean that the element or item appearing before the word covers the element or item appearing after the word and the equivalent thereof, without excluding other elements or items. Words such as "connected" or "coupled" are not limited to physical or mechanical connections, but may include electrical connections, and may be direct connections or indirect connections through intermediate media. "Top", "down", "left", "right", or the like are only used to indicate the relative position relationship. In a case that the absolute position of the described object changes, the relative position relationship may also change accordingly.

In the display field, especially the organic light emitting diode OLED display technology, a gate driving circuit is usually integrated in an integrated circuit IC. The area of a chip in integrated circuit IC design is a major factor affecting chip cost. Generally, the gate driving circuit includes a detection circuit, a display circuit, and a connection circuit (or gate circuit) that outputs a composite pulse of both. This kind of circuit structure is very complicated, thus it is difficult to meet the requirements of high-resolution and narrow frame.

When compensating a sub-pixel in an OLED display panel, in addition to providing a pixel compensation circuit in the sub-pixel for internal compensation, external compensation can also be performed by providing a sensing transistor. When external compensation is performed, a gate driving circuit including shift registers needs to provide a drive signal for a scanning transistor and a sensing transistor, respectively, to a sub-pixel in a display panel. For example, the display drive signal for the scanning transistor can be provided in a display period of a frame, and the sense drive signal for the sensing transistor can be provided in a blanking period of the frame.

In an embodiment of the present disclosure, "a frame", "each frame", or "a certain frame" includes a display period and a blanking period sequentially. For example, during the display period, the gate driving circuit outputs a display output signal. The display output signal can be used to drive the scanning transistors in the display panel to scan from a first row to a last row. During the blanking period, the gate driving circuit outputs a blanking output signal. The blanking output signal can be used to drive the sensing transistors in a row of sub-pixels in the display panel, to sense the driving current of the row of sub-pixels, such that compensation can be performed based on the sensed driving current.

When the gate driving circuit is driven at a high frequency, as the data write-in time is short, the gate line can be pre-charged, such that there is an overlap between a plurality of output waveforms, thereby improving the data write-in time. However, in a high-level voltage write-in stage, coupling noise can be easily generated at the output terminal of each shift register circuitry in the gate driving circuit.

Embodiments of the present disclosure provide a shift register circuitry and a driving method thereof, a gate driving circuit and a driving method thereof, and a display device. The embodiments of the present disclosure and examples thereof will be described in detail below with reference to the drawings.

FIG. 1 shows a schematic block diagram of a shift register circuitry 10 according to an embodiment of the present disclosure. As shown in FIG. 1, the shift register circuitry 10 may include a blanking input circuit 100, a display input circuit 200, an output circuit 300, and a first control circuit 400.

The blanking input circuit 100 may provide a blanking input signal to a pull-up control node H (not shown in FIG. 1, which will be described in detail below, with reference to FIG. 2) to control a voltage of the pull-up control node H. The blanking input circuit 100 may also provide a blanking pull-up signal to a pull-up node Q to control a voltage of the pull-up node Q.

In some embodiments, the blanking input circuit 100 may be coupled to a blanking input signal terminal STU1 to receive the blanking input signal, coupled to a first clock signal terminal CLKA to receive a first clock signal, coupled to a second clock signal terminal CLKB to receive a second clock signal, and coupled to a third clock signal terminal CLKC to receive a third clock signal. The third clock signal can be configured as a blanking pull-up signal.

For example, the blanking input circuit 100 may provide the blanking input signal to the pull-up control node H under the control of the second clock signal. The blanking input circuit 100 may also provide the blanking pull-up signal to the pull-up node Q under the control of the voltage of the pull-up control node H and the first clock signal.

In an exemplary embodiment, the blanking input circuit 100 may receive the blanking input signal and store the blanking input signal in a display period of a frame, and provide the blanking pull-up signal to the pull-up node Q according to the blanking input signal during the blanking period of the frame. In addition, the blanking input circuit 100 may also receive the blanking input signal and store the blanking input signal in a blanking period of a frame, and provide the blanking pull-up signal to the pull-up node Q according to the blanking input signal in a blanking period of the next frame.

Figure 2:
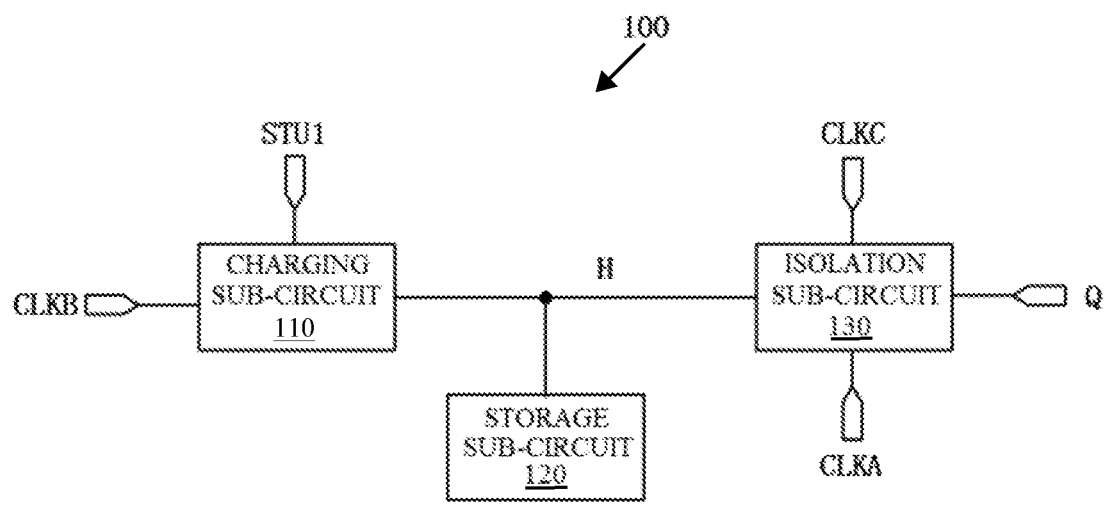
FIG. 2 illustrates a schematic block diagram of a blanking input circuit according to an embodiment of the present disclosure.

FIG. 2 shows a schematic block diagram of a blanking input circuit 100 according to an embodiment of the present disclosure. As shown in FIG. 2, the blanking input circuit 100 may include a charging sub-circuit 110, a storage sub-circuit 120, and an isolation sub-circuit 130.

The charging sub-circuit 110 may provide the blanking input signal to the pull-up control node H under the control of the second clock signal, to control the voltage of the pull-up control node H. For example, the charging sub-circuit 110 may be coupled to the second clock signal terminal CLKB to receive the second clock signal, and coupled to the blanking input signal terminal STU1 to receive the blanking input signal.

The storage sub-circuit 120 may store the blanking input signal from the charging sub-circuit. For example, the storage sub-circuit 120 may be coupled to the pull-up control node H, and coupled to a first voltage terminal VGL1 (not shown) to receive a first voltage. In an embodiment, during a display period of a frame, the storage sub-circuit 120 may charge the pull-up control node H to a high level. Therefore, the high level of the pull-up control node H is maintained until the blanking period of the frame.

In the embodiment of the present disclosure, the first voltage terminal VGL1 may provide a direct current (DC) low-level signal. That is, the first voltage is at a low level.

The isolation sub-circuit 130 may provide the blanking pull-up signal to the pull-up node Q under the control of the voltage of the pull-up control node H and the first clock signal, to control the voltage of the pull-up node Q. For example, the isolation sub-circuit 130 may be coupled to the first clock signal terminal CLKA to receive the first clock signal, and coupled to the third clock signal terminal CLKC to receive the third clock signal as the blanking pull-up signal.

As the isolation sub-circuit 130 is provided between the pull-up node Q and the pull-up control node H, it may prevent the pull-up node Q and the pull-up control node H from interfering each other. In an embodiment, for example, during the blanking period, the isolation sub-circuit 130 may disconnect the pull-up node Q and the third clock signal terminal CLKC under the control of the first clock signal. During this period, the high-level blanking pull-up signal does not affect the voltage of the pull-up node Q.

As shown in FIG. 1, the display input circuit 200 may provide a display pull-up signal to the pull-up node Q under the control of a display input signal. For example, the display input circuit 200 may be coupled to a display input signal terminal STU2 to receive a display input signal, and coupled to a second voltage terminal VDD to receive a second voltage as the display pull-up signal.

In the embodiment of the present disclosure, the second voltage terminal VDD may provide a DC high-level signal. That is, the second voltage is at a high level.

The output circuit 300 may provide an output signal to a shift signal output terminal CR and a pixel signal output terminal OUT under the control of the voltage of the pull-up node Q. For example, the output circuit 300 may be coupled to a fourth clock signal terminal CLKD to receive a fourth clock signal as the output signal.

In an embodiment, the output signal may include a display output signal and a blanking output signal. During a display period of a frame, the output circuit 300 may output the display output signal via the shift signal output terminal CR and the pixel signal output terminal OUT under the control of the voltage of the pull-up node Q. The display output signal from the shift signal output terminal CR can be configured for the scan shift of upper to lower shift register circuitries. The display output signal from the pixel signal output terminal OUT can be configured to drive sub-pixel units in the display panel for scanning display. During a blanking period of a frame, the output circuit 300 may output the blanking output signal via the shift signal output terminal CR and the pixel signal output terminal OUT under the control of the voltage of the pull-up node Q. The blanking output signal from the shift signal output terminal CR can be configured as a blanking input signal of a next-stage shift register circuitry (which will be described in detail below). The blanking output signal from the pixel signal output terminal OUT can be configured to control a transistor in a sub-pixel unit in a display panel.

In addition, the first control circuit 400 may couple the shift signal output terminal CR to the pixel signal output terminal OUT under the control of the display input signal. For example, the first control circuit 400 may be coupled to the display input signal terminal STU2 to receive the display input signal. In an embodiment, the first control circuit 400 couples the shift signal output terminal CR with the pixel signal output terminal OUT under the control of the display input signal. Therefore, a voltage of the shift signal output terminal CR can be stabilized via a load capacitor and a load resistor (not shown) at a side of the pixel signal output terminal OUT. The load capacitor may be a capacitor provided separately or a parasitic capacitor of a wire coupled to the pixel signal output terminal OUT. The load resistor may be a resistor provided separately or a parasitic resistor of a wire coupled to the pixel signal output terminal OUT.

When a high level voltage is written into the pull-up node Q during the display phase, the shift signal output terminal CR is coupled with the load capacitor and the load resistor which is coupled to the pixel signal output terminal OUT. Therefore, noise of the signal from the shift signal output CR can be reduced by the filtering effect of the load capacitor and the load resistor. In this way, the noise of the signal from the shift signal output terminal CR can be effectively reduced during high-level voltage write-in process.

With the shift register circuitry 10 in the embodiment of the present disclosure, the voltage of the pull-up node Q can be controlled by the blanking input circuit 100 and the display input circuit 200 respectively at different time periods. Moreover, the blanking input circuit 100 and the display input circuit 200 are configured with the same output circuit 300, to output both the display output signal and the blanking output signal. In addition, the first control circuit 400 can control the shift signal output terminal CR to be coupled to the pixel signal output terminal OUT of the output circuit 300, thereby reducing noise generated by the shift signal output terminal CR during the high-level voltage write-in process.

Figure 3:
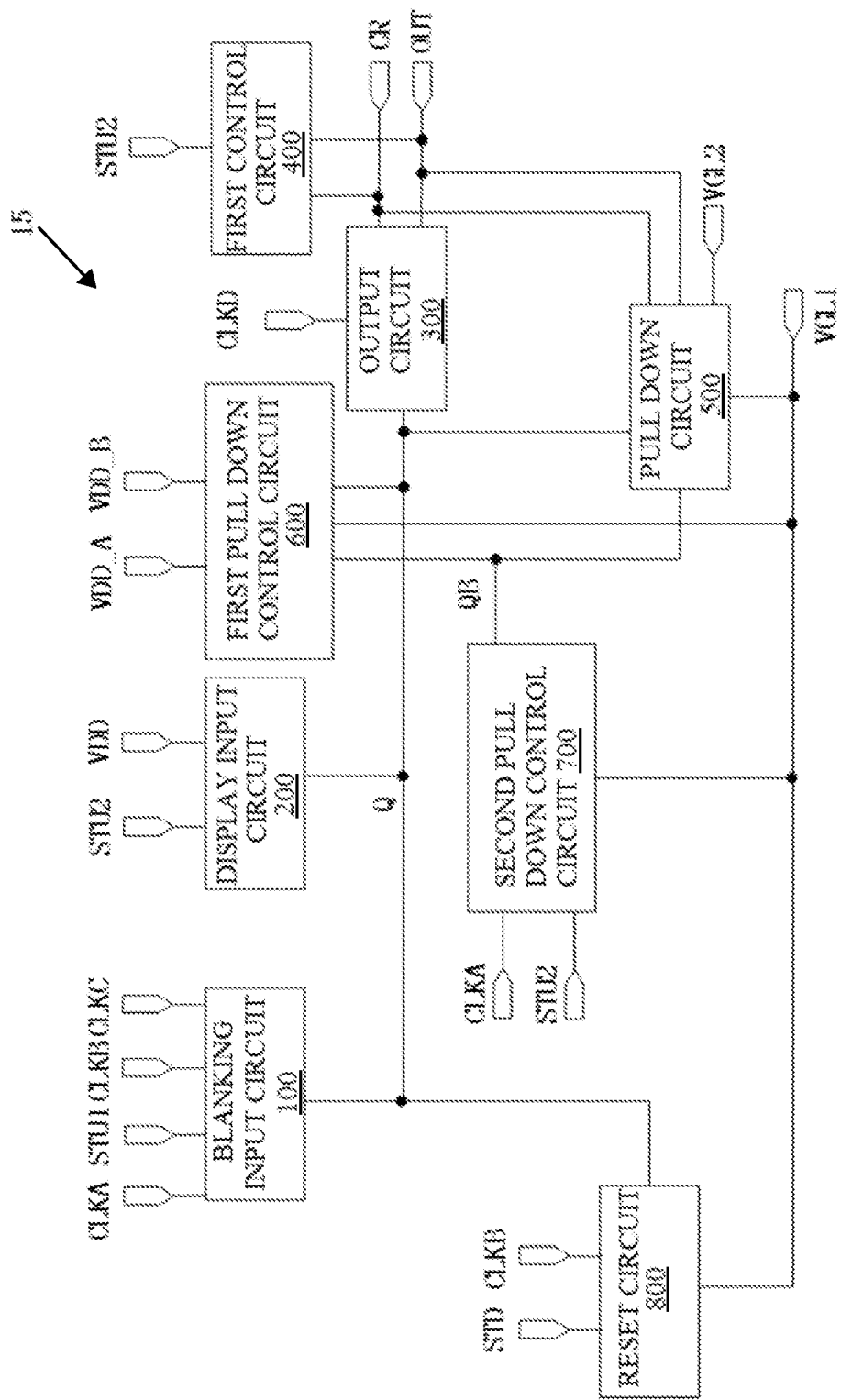
FIG. 3 illustrates a schematic block diagram of a shift register circuitry according to an embodiment of the present disclosure.

FIG. 3 shows a schematic block diagram of a shift register circuitry 15 according to an embodiment of the present disclosure. As shown in FIG. 3, the shift register circuitry 15 may include a blanking input circuit 100, a display input circuit 200, an output circuit 300, a first control circuit 400, a pull-down circuit 500, a first pull-down control circuit 600, a second pull-down control circuit 700, and a reset circuit 800. The blanking input circuit 100, the display input circuit 200, the output circuit 300, and the first control circuit 400 have been described in detail above, and are not repeated here.

In an embodiment, the pull-down circuit 500 may perform noise reduction on the pull-up node Q, the shift signal output terminal CR, and the pixel signal output terminal OUT under the control of the voltage of the pull-down node QB. For example, the pull-down circuit 500 may be coupled to a first voltage terminal VGL1 to receive a first voltage, and coupled to a third voltage terminal VGL2 to receive a third voltage. In an embodiment, the pull-down circuit 500 may, under the control of the voltage of the pull-down node QB, control the voltages of the pull-up node Q and the shift signal output terminal CR according to the first voltage of the first voltage terminal VGL1, and control the voltage of the pixel signal output terminal OUT according to the third voltage terminal VGL2. Therefore, the pull-down circuit 500 can reduce the noise of signals from the pull-up node Q, the shift signal output terminal CR, and the pixel signal output terminal OUT.

In the embodiment of the present disclosure, the third voltage terminal VGL2 may provide a DC low-level signal. That is, the third voltage is at a low level.

The first pull-down control circuit 600 may control the voltage of the pull-down node QB under the control of the voltage of the pull-up node Q. For example, the first pull-down control circuit 600 may be coupled to the first voltage terminal VGL1 to receive the first voltage, and coupled to the fourth voltage terminal VDD_A to receive the fourth voltage. In an embodiment, when the voltage of the pull-up node Q is at a high level, the first pull-down control circuit 600 may pull the voltage of the pull-down node QB to a low level via a first voltage (for example, a low level). When the voltage of the pull-up node Q is at a low level, the first pull-down control circuit 600 may charge the pull-down node QB with a fourth voltage (for example, a high level), to pull the voltage of the pull-down node QB to a high level.

In another example, the first pull-down control circuit 600 may also be coupled to a fifth voltage terminal VDD_B to receive a fifth voltage (for example, at a high level). For example, the fourth voltage terminal VDD_A and the fifth voltage terminal VDD_B may be configured to alternately provide a high level voltage. That is, the fourth voltage terminal VDD_A provides a high level voltage while the fifth voltage terminal VDD_B provides a low level voltage. On the other hand, the fourth voltage terminal VDD_A provides a low level voltage while the fifth voltage terminal VDD_B provides a high level voltage. In an embodiment, when the voltage of the pull-up node Q is at a low level, the first pull-down control circuit 600 may charge the pull-down node QB, with the fourth voltage or the fifth voltage, to pull the voltage of the pull-down node QB to a high level.

The second pull-down control circuit 700 can control the voltage of the pull-down node QB under the control of the blanking pull-down control signal. For example, the second pull-down control circuit 700 may be coupled to the first clock signal terminal CLKA to receive the first clock signal as the blanking pull-down control signal, and coupled to the first voltage terminal VGL1 to receive the first voltage. In an embodiment, during a blanking period of a frame, the second pull-down control circuit 700 may be enabled in response to the first clock signal, such that the pull-down node QB may be pulled down to a low level via the first voltage terminal VGL1. In this way, during the blanking period, it can prevent the voltage of the pull-down node QB from affecting the pull-up node Q, such that the blanking input circuit 100 may fully charge the pull-up node Q. It can be noted that, in the embodiment of the present disclosure, the second pull-down control circuit 700 may also be coupled to other signal terminals to receive the blanking pull-down control signal, which is not limited in this disclosure.

In addition, the second pull-down control circuit 700 can also control the voltage of the pull-down node QB under the control of the display pull-down control signal. For example, the second pull-down control circuit 700 may be coupled to the display input signal terminal STU2 to receive the display input signal as the display pull-down control signal, and coupled to the first voltage terminal VGL1 to receive the first voltage. In an embodiment, during a display period of a frame, while the display input signal is provided to the display input circuit 200 to charge the pull-up node Q, the display input signal is also provided to the second pull-down control circuit 700, such that the pull-down node QB can be pulled down to a low level via the first voltage terminal VGL1. In this way, it can prevent the voltage of the pull-down node QB from affecting the pull-up node Q during the display period, such that the display input circuit 200 fully charges the pull-up node Q. It can be noted that, in the embodiment of the present disclosure, the second pull-down control circuit 700 may also be coupled to other signal terminals to receive the display pull-down control signal, which is not limited in this disclosure.

On the other hand, the reset circuit 800 can reset the voltage of the pull-up node Q under the control of the blanking reset signal. For example, the reset circuit 800 may be coupled to the second clock signal terminal CLKB to receive the second clock signal as the blanking reset signal, and coupled to the first voltage terminal VGL1 to receive the first voltage. It can be noted that, in the embodiment of the present disclosure, the reset circuit 800 may also be coupled to other signal terminals to receive the blanking reset signal, which is not limited in the present disclosure.

In addition, the reset circuit 800 can also reset the voltage of the pull-up node Q under the control of a display reset signal. For example, the reset circuit 800 may be coupled to the display reset signal terminal STD to receive the display reset signal, and coupled to the first voltage terminal VGL1 to receive the first voltage.

Those skilled in the art can understand that although FIG. 3 shows that the shift register circuitry 10 includes the pull-down circuit 500, the first pull-down control circuit 600, the second pull-down control circuit 700, and the reset circuit 800, the protection scope of the present disclosure is not limited to the above examples. In practical applications, the skills in the art may choose to use or not use one or more of the above circuits according to actual situations. Various combinations and modifications of the foregoing circuits, which are not deviated from the principles of the present disclosure, also belongs to the protection scope of the present disclosure, and details may not be described herein.

Figure 4:
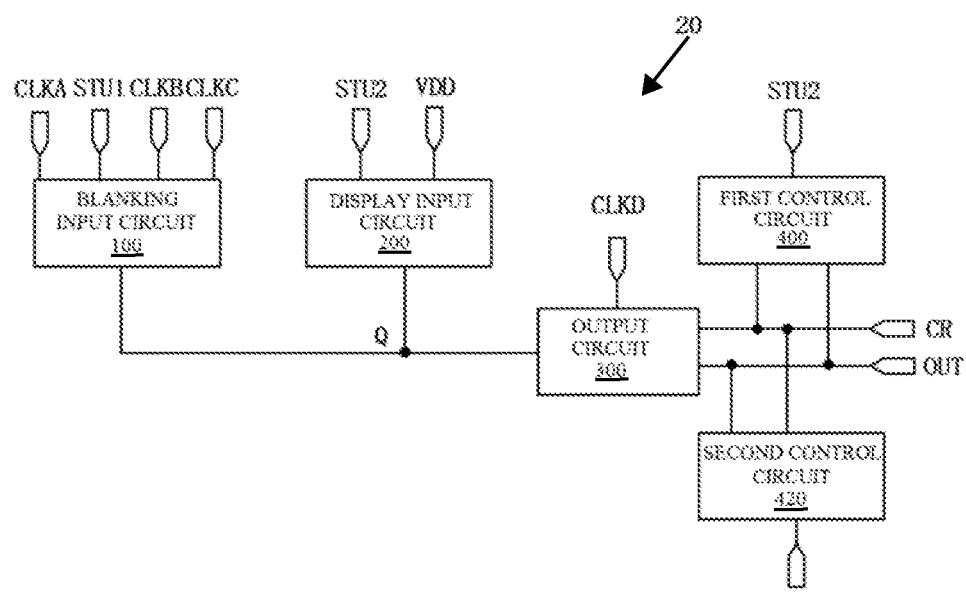
FIG. 4 illustrates a schematic block diagram of a shift register circuitry according to an embodiment of the present disclosure.

FIG. 4 shows a schematic block diagram of a shift register circuitry 20 according to another embodiment of the present disclosure. As shown in FIG. 4, the shift register circuitry 20 may include a blanking input circuit 100, a display input circuit 200, an output circuit 300, a first control circuit 400, and a second control circuit 420. The blanking input circuit 100, the display input circuit 200, the output circuit 300, and the first control circuit 400 can be reference to the description above, and are not repeated here.

The second control circuit 420 can couple the shift signal output terminal CR to the pixel signal output terminal OUT under the control of the first clock signal. For example, the second control circuit 420 may be coupled to the first clock signal terminal CLKA to receive the first clock signal. In an embodiment, the second control circuit 420 may couple the shift signal output terminal CR to the pixel signal output terminal OUT under the control of the first clock signal, thereby stabilizing the voltage of the shift signal output terminal CR via the load capacitor and the load resistor (not shown) coupled to the pixel signal output terminal OUT. In an embodiment, for example, during the blanking period, the isolation sub-circuit 130 may control the connection between the pull-up node Q and the third clock signal terminal CLKC according to the first clock signal. Therefore, during the process of connecting the pull-up node Q with the third clock signal terminal CLKC according to the first clock signal, when the high-level voltage is write into the pull-up node Q according to the blanking pull-up signal, the noise of the signal from the shift signal output terminal CR can be reduced via the load capacitor and the load resistor. In this way, the noise of the signal from the shift signal output terminal CR can be effectively reduced during the high-level voltage write-in process.

Figure 5:
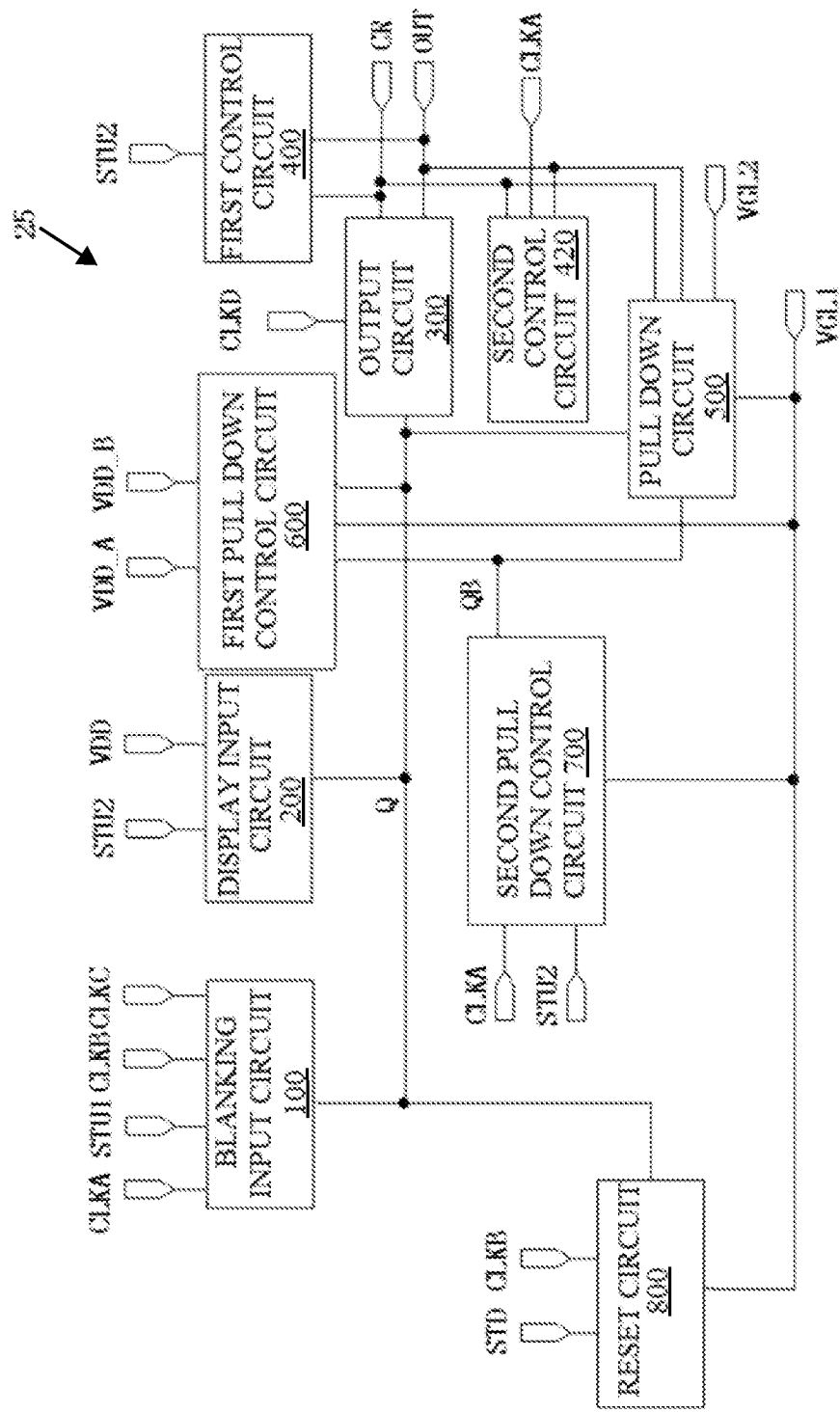
FIG. 5 illustrates a schematic block diagram of a shift register circuitry according to an embodiment of the present disclosure.

Accordingly, FIG. 5 illustrates an exemplary circuit diagram of a shift register circuitry according to an embodiment of the present disclosure. As shown in FIG. 5, the shift register 25 may include a blanking input circuit 100, a display input circuit 200, an output circuit 300, a first control circuit 400, a second control circuit 420, a pull-down circuit 500, a first pull-down control circuit 600, a second pull-down control circuit 700, and a reset circuit 800. The respective circuits are described in detail above, and may not be repeated here.

In an embodiment of the present disclosure, the shift register circuitry may further include a load capacitor and a load resistor (not shown). One end of the load capacitor may be coupled to the pixel signal output terminal, and the other end may be grounded. One end of the load resistor may be coupled to the pixel signal output terminal, and the other end may be grounded. As described above, the load capacitor may be a capacitor provided additionally or a parasitic capacitor of a wire coupled to the pixel signal output terminal OUT. The load resistor may be a resistor provided separately or a parasitic resistor of a wire coupled to the pixel signal output terminal OUT.

The shift register circuitry can be described below through an example circuit structure according to the present disclosure.

Figure 6:
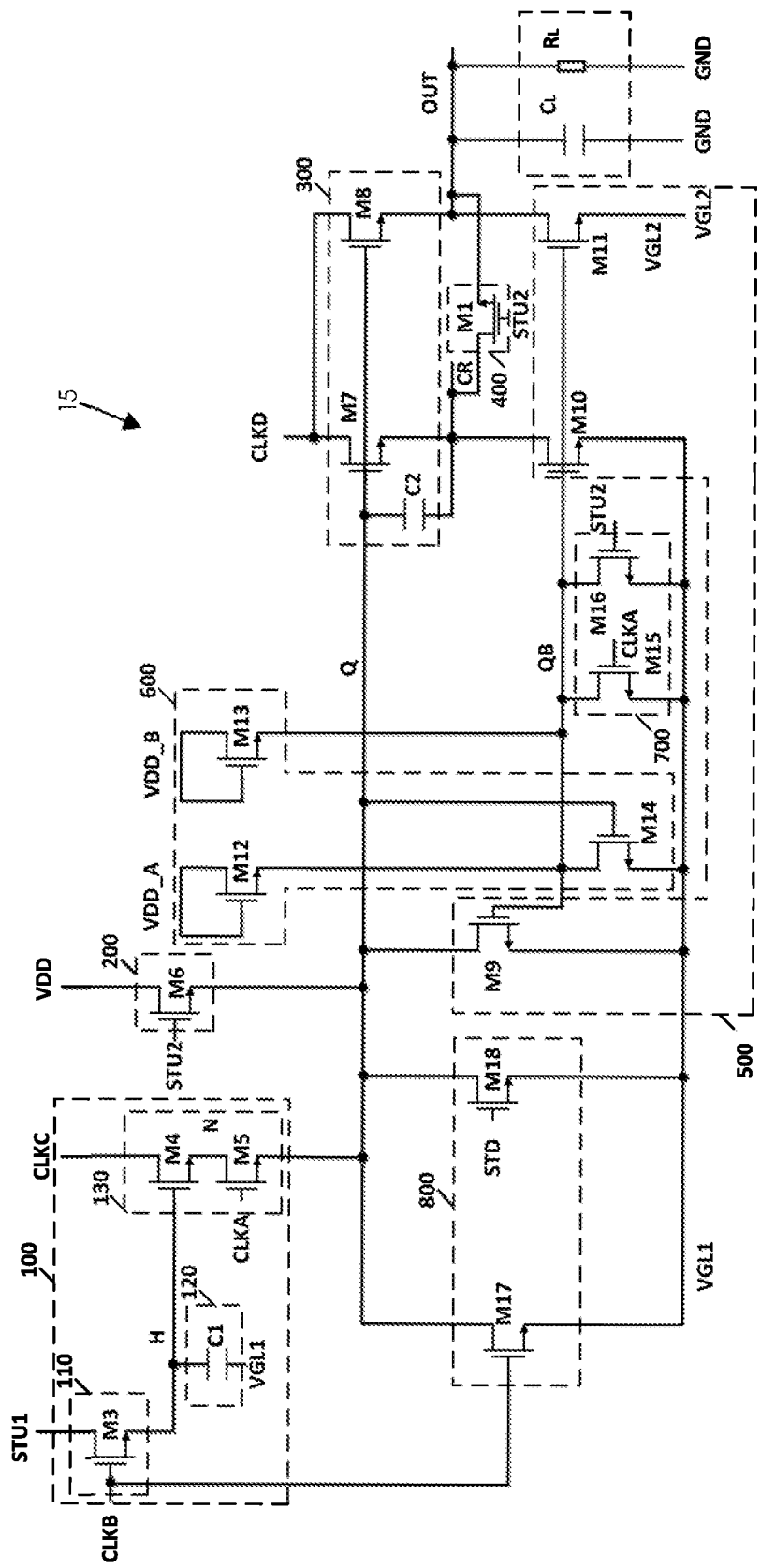
FIG. 6 illustrates an exemplary circuit diagram of a shift register circuitry according to an embodiment of the present disclosure.

FIG. 6 illustrates an exemplary circuit diagram of a shift register circuitry according to an embodiment of the present disclosure. The shift register circuitry is, for example, the shift register circuitry 15 shown in FIG. 3. As shown in FIG. 6, the shift register circuitry may include a first transistor M1 to a seventeenth transistor M17, a first capacitor C1 and a second capacitor C2, a load capacitor CL, and a load resistor RL.

It can be noted that the transistors used in the embodiments of the present disclosure may be thin film transistors or field effect transistors or other switching devices with like characteristics. In the embodiments of the present disclosure, the thin film transistor is taken as an example for description. A source and a drain of the transistor herein can be symmetrical in structure, thus there can be no difference in structure of the source and the drain of the transistor. In an embodiment of the present disclosure, in order to distinguish the two electrodes of the transistor other than the gate, one electrode can be referred to as a first electrode and the other electrode can be referred to as a second electrode. The gate of the transistor can be referred to as a control electrode. In addition, the transistors may include N-type and P-type transistors according to the characteristics of the transistors. If the transistor is a P-type transistor, the enable voltage is a low-level voltage, for example, 0V, −5V, −10V, or other suitable voltage, and the disable voltage is a high-level voltage, for example, 5V, 10V, or the like. If the transistor is an N-type transistor, the enable voltage is a high-level voltage, for example, 5V, 10V, or other suitable voltage, and the disable voltage is a low-level voltage, for example, 0V, −5V, −10V, or the like.

In addition, it should be noted that the transistors in the shift register circuitry 10 provided in the embodiments of the present disclosure are all described by taking N-type transistors (for example, NMOS transistors) as examples. Embodiments of the present disclosure include, but are not limited to, for example, at least part of the transistors in the shift register circuitry 10 may also be the P-type transistor (for example, a PMOS transistor).

As shown in FIG. 6, the charging sub-circuit 110 in the blanking input circuit 100 may include a third transistor M3. A gate of the third transistor M3 is coupled to the second clock signal terminal CLKB to receive the second clock signal. A first electrode of the third transistor M3 is coupled to the blanking input signal terminal STU1 to receive the blanking input signal. A second electrode of the third transistor M3 is coupled to the pull-up control node H. In an embodiment, the third transistor M3 is turned on when the second clock signal is at a high level, such that the blanking input signal can be provided to the pull-up control node H to perform charging.

The storage sub-circuit 120 in the blanking input circuit 100 may include a first capacitor C1. A first end of the first capacitor C1 is coupled to the pull-up control node H, and a second end of the first capacitor C1 is coupled to the first voltage terminal VGL1 to receive the first voltage. The voltage of the pull-up control node H can be maintained via the first capacitor C1. In an embodiment, during the display period of a frame, the voltage of the pull-up control node H can be charged via the third transistor M3 to a high level, and the high-level voltage of the pull-up control node H can be maintained via the first capacitor C1 until the blanking period of the frame.

In the blanking input circuit 100, the isolation sub-circuit 130 may include a fourth transistor M4 and a fifth transistor M5. A gate of the fourth transistor M4 is coupled to the pull-up control node H. A first electrode of the fourth transistor M4 is coupled to the third clock signal terminal CLKC to receive the third clock signal as the blanking pull-up signal. A second electrode of the fourth transistor M4 is coupled to a first electrode of the fifth transistor M5. A gate of the fifth transistor M5 is coupled to the first clock signal terminal CLKA to receive the first clock signal, and a second electrode of the fifth transistor M5 is coupled to the pull-up node Q. In an embodiment, during a blanking period of a frame, the fourth transistor M4 may be turned on under the control of the voltage of the pull-up control node H. When the first clock signal is at a high level, the fifth transistor M5 is turned on. Therefore, the third clock signal can charge the pull-up node Q via the fourth transistor M4 and the fifth transistor M5.

The display input circuit 200 may include a sixth transistor M6. A gate of the sixth transistor M6 is coupled to the display input signal terminal STU2 to receive the display input signal. A first electrode of the sixth transistor M6 is coupled to the second voltage terminal VDD to receive the second voltage as the display pull-up signal. A second electrode of the sixth transistor M6 is coupled to the pull-up node Q. In an embodiment, during a display period of a frame, the sixth transistor M6 may be turned on under the control of the display input signal, such that the pull-up node Q is charged by the second voltage.

The output circuit 300 may include a seventh transistor M7, an eighth transistor M8, and a second capacitor. A gate of the seventh transistor M7 is coupled to the pull-up node Q, a first electrode of the seventh transistor M7 is coupled to the fourth clock signal terminal CLKD to receive the fourth clock signal as an output signal, and a second electrode of the seventh transistor M7 is coupled to the shift signal output terminal CR. A gate of the eighth transistor M8 is coupled to the pull-up node Q, a first electrode of the eighth transistor M8 is coupled to the fourth clock signal terminal CLKD to receive the fourth clock signal as an output signal, and a second electrode of the eighth transistor M8 is coupled to the pixel signal output terminal OUT. A first end of the second capacitor C2 is coupled to the pull-up node Q, and the second end of the second capacitor C2 is coupled to the second electrode of the seventh transistor M7. In an embodiment, when the voltage of the pull-up node Q is at a high level, the seventh transistor M7 and the eighth transistor M8 are turned on. Therefore, the fourth clock signal can be output as the output signal to the shift signal output terminal CR and the pixel signal output terminal OUT, respectively.

The first control circuit 400 may include a first transistor M1. A gate of the first transistor M1 is coupled to the display input signal terminal STU2 to receive the display input signal. A first electrode of the first transistor M1 is coupled to the shift signal output terminal CR. A second electrode of the first transistor M1 is coupled to the pixel signal output terminal OUT.

The pull-down circuit 500 may include a ninth transistor M9, a tenth transistor M10, and an eleventh transistor M11. A gate of the ninth transistor M9 is coupled to the pull-down node QB, a first electrode of the ninth transistor M9 is coupled to the pull-up node Q, and a second electrode of the ninth transistor M9 is coupled to the first voltage terminal VGL1 to receive the first Voltage. A gate of the tenth transistor M10 is coupled to the pull-down node QB, a first electrode of the tenth transistor M10 is coupled to the shift signal output terminal CR, and a second electrode of the tenth transistor M10 is coupled to the first voltage terminal VGL1 to receive the first voltage. A gate of the eleventh transistor M11 is coupled to the pull-down node QB, a first electrode of the eleventh transistor M11 is coupled to the pixel signal output terminal OUT, and a second electrode of the eleventh transistor M11 is coupled to the third voltage terminal VGL2 to receive the third voltage.

The first pull-down control circuit 600 may include a twelfth transistor M12, a thirteenth transistor M13, and a fourteenth transistor M14. A gate and a first electrode of the twelfth transistor M12 are coupled to the fourth voltage terminal VDD_A to receive the fourth voltage, and a second electrode of the twelfth transistor M12 is coupled to the pull-down node QB. A gate and a first electrode of the thirteenth transistor M13 are coupled to the fifth voltage terminal VDD_B to receive the fifth voltage, and a second electrode of the thirteenth transistor M13 is coupled to the pull-down node QB. A gate of the fourteenth transistor M14 is coupled to the pull-up node Q, a first electrode of the fourteenth transistor M14 is coupled to the pull-down node QB, and a second electrode of the fourteenth transistor M14 is coupled to the first voltage terminal VGL1 to receive the first voltage.

In an embodiment, the fourth voltage terminal VDD_A and the fifth voltage terminal VDD_B may be configured to alternately provide a high level signal. That is, the fourth voltage terminal VDD_A provides a high level signal while the fifth voltage terminal VDD_B provides a low level signal. Moreover, the fourth voltage terminal VDD_A provides a low level signal while the fifth voltage terminal VDD_B provides a high level signal. Therefore, only one of the twelfth transistor M12 and the thirteenth transistor M13 is turned on. This can avoid performance drift caused by long-term conduction of the transistors. The fourth voltage can charge the pull-down node QB when the twelfth transistor M12 is turned on, or the fifth voltage can charge the pull-down node QB when the thirteenth transistor M13 is turned on, thereby pulling up the voltage of the pull-down node QB to a high level. When the voltage of the pull-up node Q is at a high level, the fourteenth transistor M14 is turned on. For example, in the design of the transistor, the fourteenth transistor M14 and the twelfth transistor M12 (or the thirteenth transistor M13) can be configured (for example, by setting the size ratio of the two transistors, the threshold voltages, or the like), such that when both the fourteenth transistor M14 and the twelfth transistor M12 (or the thirteenth transistor M13) are turned on, the voltage of the pull-down node QB can be pulled down to a low level, which can maintain the ninth transistor M9, the tenth transistor M10, and the eleventh transistor M11 disabled.

On the other hand, when the voltage of the pull-down node QB is at a high level, the ninth transistor M9 and the tenth transistor M10 in the pull-down circuit 500 are turned on, such that the pull-up node Q and the shift signal output terminal CR can be pulled down by the first voltage terminal VGL1, to reduce the noise of the pull-up node Q and the shift signal output terminal CR. In addition, when the voltage of the pull-down node QB is high, the eleventh transistor M11 is also turned on, such that the pixel signal output terminal OUT can be pulled down via the third voltage terminal VGL2, to reduce the noise of the pixel signal output terminal OUT.

In an example, the first voltage and the third voltage may be different. For example, the first voltage is set to −10V, and the third voltage is set to −6V. In another example, the third voltage terminal VGL2 may not be provided, and the second electrode of the eleventh transistor M11 may be coupled to the first voltage terminal VGL1 to receive the first voltage, which is not limited in the embodiments of the present disclosure.

As shown in FIG. 6, the second pull-down control circuit 700 may include a fifteenth transistor M15 and a sixteenth transistor M16.

A gate of the fifteenth transistor M15 is coupled to the first clock signal terminal CLKA to receive the first clock signal as the blanking pull-down control signal. A first electrode of the fifteenth transistor M15 is coupled to the pull-down node QB. A second electrode of the fifteenth transistor M15 is coupled to the first voltage terminal VGL1 to receive the first voltage. In an embodiment, when the first clock signal is at a high level, the fifteenth transistor M15 is turned on, such that the pull-down node QB can be pulled down via the first voltage terminal VGL1. In this way, the influence of the pull-down node QB on the pull-up node Q can be reduced during the blanking period of a frame, such that the blanking input circuit 100 may fully charge the pull-up node Q.

A gate of the sixteenth transistor M16 is coupled to the display input signal terminal STU2 to receive the display input signal as the display pull-down control signal. A first electrode of the sixteenth transistor M16 is coupled to the pull-down node QB. A second electrode of the sixteenth transistor M16 is coupled to the first voltage terminal VGL1 to receive the first voltage. In an embodiment, when the display input signal is at a high level, the sixteenth transistor M16 is turned on, such that the pull-down node QB can be pulled down via the first voltage terminal VGL1. In this way, the influence of the pull-down node QB on the pull-up node Q can be reduced during the display period of a frame, such that the display input circuit 200 may fully charge the pull-up node Q.

As shown in FIG. 6, the reset circuit 800 may include a seventeenth transistor M17 and an eighteenth transistor M18.

A gate of the seventeenth transistor M17 is coupled to the second clock signal terminal CLKB to receive the second clock signal as the blanking reset signal. A first electrode of the seventeenth transistor M17 is coupled to the pull-up node Q. A second electrode of the seventeenth transistor M17 is coupled to the first voltage terminal VGL1 to receive the first voltage. For example, when the second clock signal is at a high level, the seventeenth transistor M17 is turned on, such that the pull-up node Q can be reset by the first voltage terminal VGL1.

A gate of the eighteenth transistor M18 is coupled to the display reset signal terminal STD to receive the display reset signal. A first electrode of the eighteenth transistor M18 is coupled to the pull-up node Q, and a second electrode of the eighteenth transistor M18 is coupled to the first voltage terminal VGL1 to receive the first voltage. For example, when the display reset signal is at a high level, the eighteenth transistor M18 is turned on, such that the first voltage terminal VGL1 can be configured to reset the voltage of the pull-up node Q.

In addition, one end of the load capacitor CL is coupled to the pixel signal output terminal, and the other end is grounded. One end of the load resistor RL is coupled to the pixel signal output terminal, and the other end is grounded.

As mentioned above, in the shift register circuitry according to the embodiment of the present disclosure, the first capacitor C1 can be configured to maintain the voltage of the pull-up control node H, and the second capacitor C2 can be configured to maintain the voltage of the pull-up node Q. At least one of the first capacitor C1, the second capacitor C2, and the load capacitor CL may be a capacitor manufactured through a manufacturing process. For example, the capacitor can be realized by manufacturing special capacitor electrodes, wherein the respective electrodes of the capacitor may be manufactured with metal layers and semiconductor layers (such as doped polysilicon). In addition, at least one of the first capacitor C1, the second capacitor C2, and the load capacitor CL may also be implemented by a parasitic capacitor between the respective devices. In addition, the connection manner of at least one of the first capacitor C1, the second capacitor C2, and the load capacitor CL is not limited to the above-described manner, and may also be any other applicable connection manners.

Figure 7:
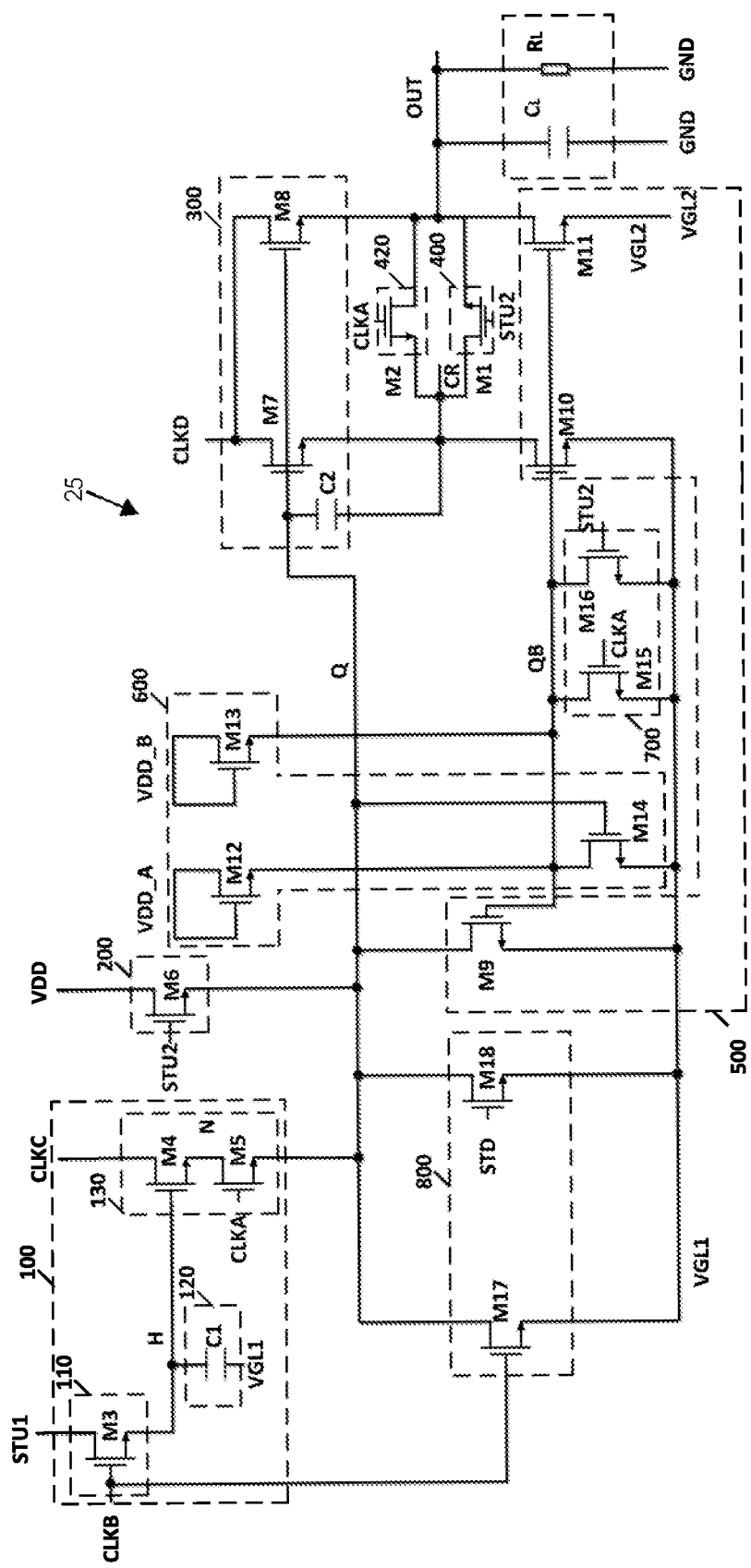
FIG. 7 illustrates an exemplary circuit diagram of a shift register circuitry according to an embodiment of the present disclosure.

FIG. 7 illustrates an exemplary circuit diagram of a shift register circuitry according to an embodiment of the present disclosure. The shift register circuitry is, for example, the shift register circuitry 25 shown in FIG. 5, in which the circuit structures of the input circuit 100, the display input circuit 200, the output circuit 300, the first control circuit 400, the pull-down circuit 500, and the first pull-down control circuit 600, the second pull-down control circuit 700, the reset circuit 800, the load capacitor and the load resistor (not shown) are the same as the circuit structures of the corresponding circuits in FIG. 6, and are not repeated here.

As shown in FIG. 7, the second control circuit 420 may include a second transistor M2. A gate of the second transistor M2 is coupled to the first clock signal terminal CLKA to receive the first clock signal, a first electrode of the second transistor M2 is coupled to the shift signal output terminal CR, and a second electrode of the second transistor M2 is coupled to the pixel signal output terminal OUT.

Embodiments of the present disclosure also provide a gate driving circuit including shift register circuitries.

Figure 8:
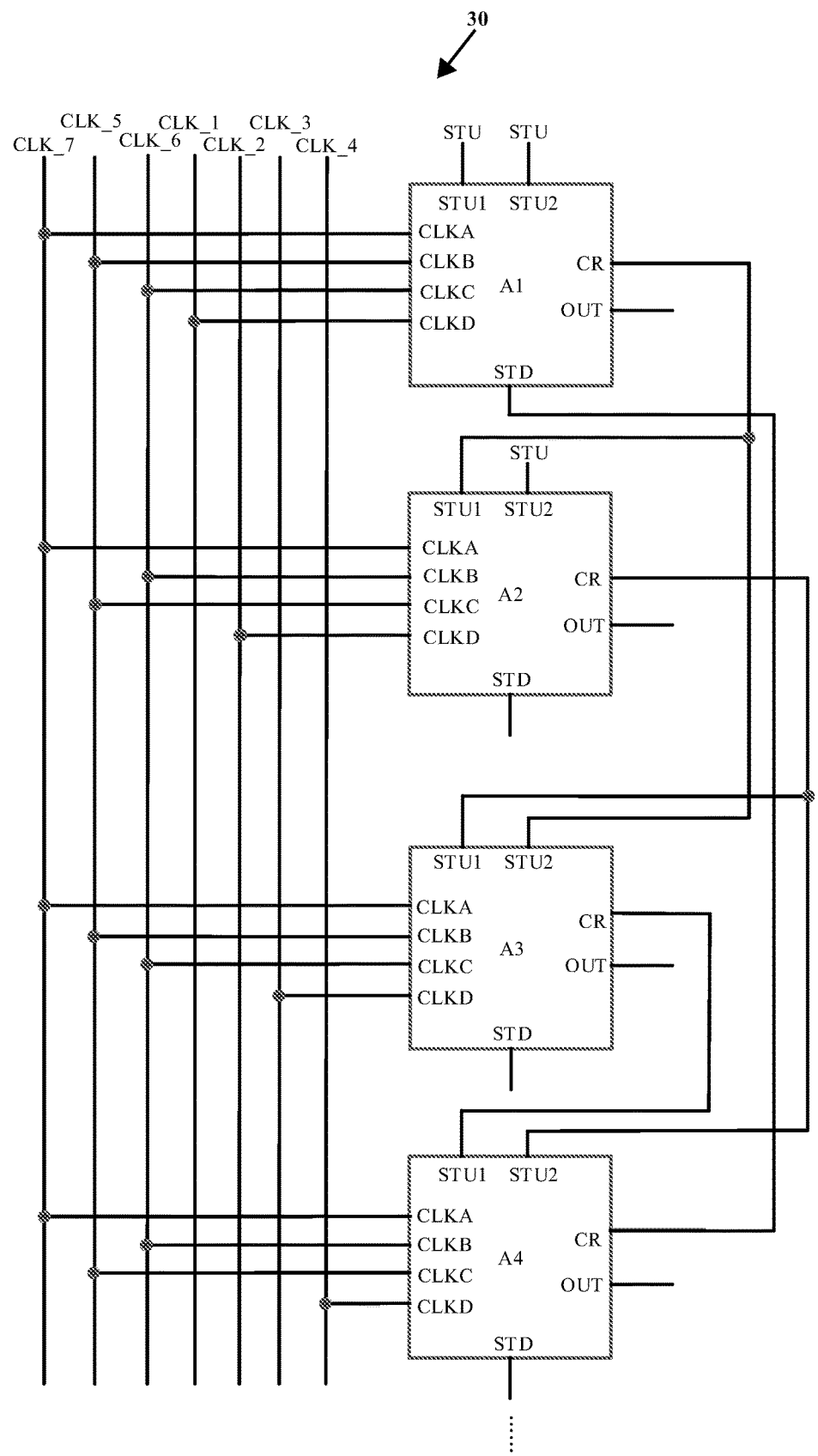
FIG. 8 illustrates a schematic diagram of a gate driving circuit according to an embodiment of the present disclosure.

FIG. 8 illustrates a schematic diagram of a gate driving circuit according to an embodiment of the present disclosure. The gate driving circuit 30 may include a plurality of cascaded shift register circuitries, where any one or more of the shift register circuitries may adopt the structure of the shift register circuitry 10, the shift register circuitry 15, the shift register circuitry 20 or the shift register circuitry 25, or a modification thereof. It should be noted that FIG. 5 schematically illustrates only the first four stages of the shift register circuitries (A1, A2, A3, and A4) of the gate driving circuit 30. It can be understood that if the shift register circuitry in the gate driving circuit is adopted with the structure of the shift register circuitries 10 or 20, the shift register circuitry does not have the display reset signal terminal STD.

As shown in FIG. 8, the gate driving circuit 30 further includes a first sub-clock signal line CLK_1, a second sub-clock signal line CLK_2, a third sub-clock signal line CLK_3, and a fourth sub-clock signal line CLK_4. The first sub-clock signal line provides a fourth clock signal to the shift register circuitry at the $(4n-3)^{th}$ stage (for example, the 1st stage, the 5th stage, the 9th stage, and the like). The second sub-clock signal line provides a fourth clock signal to the shift register circuitry at the $(4n-2)^{th}$ stage (for example, the 2nd stage, the 6th stage, the 10th stage, and the like). The third sub-clock signal line provides a fourth clock signal to the shift register circuitry at the $(4n-1)^{th}$ stage (for example, the 3rd stage, the 7th stage, the 11th stage, and the like). The fourth sub-clock signal line provides a fourth clock signal to the shift register circuitry at the $4n^{th}$ stage (for example, the 4th stage, the 8th stage, the 12th stage, and the like). In an embodiment, the fourth clock signal can be configured as an output signal.

In an embodiment, as described above, the shift register circuitry may include a fourth clock signal terminal CLKD. As shown in FIG. 8, the fourth clock signal terminal CLKD of the shift register circuitry at the $(4n-3)^{th}$ stage is coupled to the first sub-clock signal line CLK_1, the fourth clock signal terminal CLKD of the shift register circuitry at the $(4n-2)^{th}$ stage is coupled to the second sub-clock signal line CLK_2, the fourth clock signal terminal CLKD of the shift register circuitry at the $(4n-1)^{th}$ stage is coupled to the third sub-clock signal line CLK_3, and the fourth clock signal terminal CLKD of the shift register circuitry at the $4n^{th}$ stage is coupled to the fourth sub-clock signal line CLK_4. N is an integer greater than 0.

As shown in FIG. 8, the gate driving circuit 30 may further include a fifth sub-clock signal line CLK_5 and a sixth sub-clock signal line CLK_6. The fifth sub-clock signal line provides a second clock signal to the shift register circuitry at the $(2n-1)^{th}$ stage (for example, the 1st stage, the 3rd stage, the 5th stage, and the like), and provides a third clock signal to the shift register circuitry at the $2n^{th}$ stage (for example, the 2nd stage, 4th stage, 8th stage, and the like). The sixth sub-clock signal line provides a third clock signal to the shift register circuitry at the $(2n-1)^{th}$ stage, and provides a second clock signal to the shift register circuitry at the $2n^{th}$ stage. In an embodiment, the third clock signal can be used as a blanking pull-up signal.

In an embodiment, as described above, the shift register circuitry may include a second clock signal terminal CLKB and a third clock signal terminal CLKC. As shown in FIG. 8, the second clock signal terminal CLKB of the shift register circuitry at the $(2n-1)^{th}$ stage is coupled to the fifth sub-clock signal line CLK_5, and the third clock signal terminal CLKC of the shift register circuitry at the $(2n-1)^{th}$ stage is coupled to the sixth sub-clock signal line CLK_6. The second clock signal terminal CLKB of the shift register circuitry at the $2n^{th}$ stage is coupled to the sixth sub-clock signal line CLK_6, and the third clock signal terminal CLKC of the shift register circuitry at the $2n^{th}$ stage is coupled to the fifth sub-clock signal line CLK_5. N is an integer greater than 0.

In addition, the gate driving circuit 30 may further include a seventh sub-clock signal line CLK_7. The seventh sub-clock signal line provides a first clock signal to the respective shift register circuitries. In an embodiment, the first clock signal terminal CLKA of the respective shift register circuitries is coupled to the seventh sub-clock signal line CLK_7.

In the embodiment of the present disclosure, the blanking input signal terminal STU1 and the display input signal terminal STU2 of the first-stage shift register circuitry A1 and the display input signal terminal STU2 of the second-stage shift register circuitry A2 are both coupled to the input signal line STU (Not shown), to receive a trigger signal STV, for example.

In addition, the shift signal output terminal of the shift register circuitry at the $n^{th}$ stage provides the blanking input signal to the shift register circuitry at the $(n+1)^{th}$ stage. For example, the blanking input signal terminal STU1 of the shift register circuitry at the $(n+1)^{th}$ stage is coupled to the shift signal output terminal CR of the shift register circuitry at the $n^{th}$ stage. As shown in the FIG. 8, the shift signal output terminal CR of the first stage shift register circuitry A1 is coupled to the blanking input signal terminal STU1 of the second stage shift register circuitry A2. The shift signal output terminal CR of the second stage shift register circuitry A2 is coupled to the blanking input signal terminal STU1 of the third stage shift register circuitry A3. The shift signal output terminal CR of the third stage shift register circuitry A3 is coupled to the blanking input signal terminal STU1 of the fourth stage shift register circuitry A4.

The shift signal output terminal of the shift register circuitry at the $n^{th}$ stage provides a display input signal to the shift register circuitry at the $(n+2)^{th}$ stage. For example, the display input signal terminal STU2 of the shift register circuitry at the $(n+2)^{th}$ stage is coupled to the shift signal output terminal CR of the shift register circuitry at the $n^{th}$ stage. As shown in the FIG. 8, the shift signal output terminal CR of the first-stage shift register circuitry A1 is coupled to the display input signal terminal STU2 of the third-stage shift register circuitry A3. The shift signal output terminal CR of the second stage shift register circuitry A2 is coupled to the display input signal terminal STU2 of the fourth stage shift register circuitry A4.

The shift signal output terminal of the stage shift register circuitry at the $(n+3)^{th}$ provides a display reset signal to the stage shift register circuitry at the $n^{th}$ stage. For example, besides of the shift register circuitries at the last three stages, the display reset signal terminal STD of the stage shift register circuitry at the $n^{th}$ stage is coupled to the shift signal output terminal CR of the stage shift register circuitry at the $(n+3)^{th}$. N is an integer greater than 0. As shown in FIG. 8, the display reset signal terminal STD of the first stage shift register circuitry A1 is coupled to the shift signal output terminal CR of the fourth stage shift register circuitry A4. In some embodiments, the display reset signal terminal STD of the shift register circuitries at the last three stages may be coupled to a shift signal output terminal of a dummy shift register circuitry, or coupled to a display reset signal line STD (not shown), or coupled to any other appropriate signal lines respectively.

It can be understood that FIG. 8 only schematically illustrates the connection relationship between the shift register circuitries, but in no way to make limitations. There may also be other appropriate connections not shown.

The working process of the gate driving circuit 30 shown in FIG. 8 can be described below in detail with reference to FIG. 9.

Figure 9:
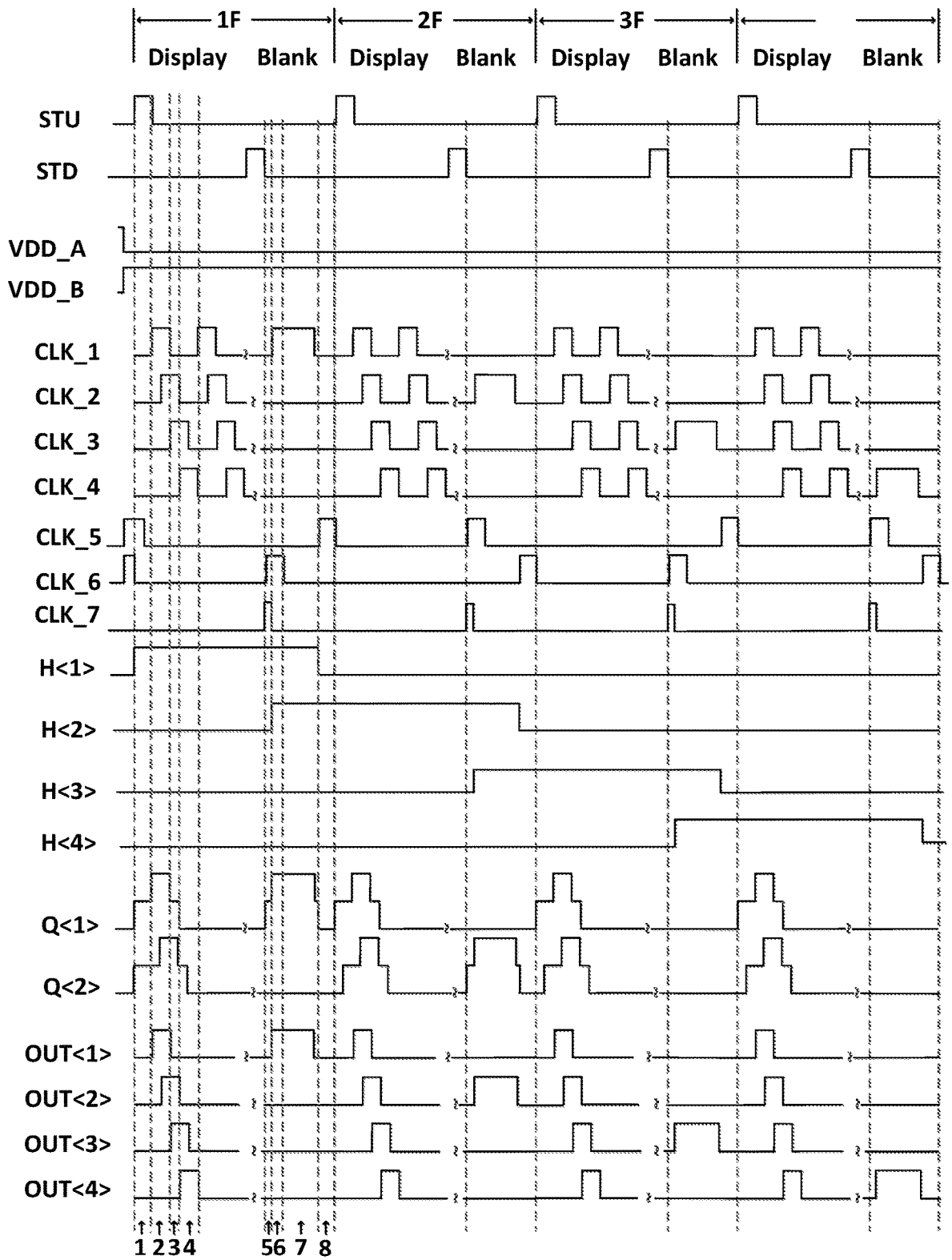
FIG. 9 illustrates a timing chart of signals during an operation of a gate driving circuit according to an embodiment of the present disclosure.

FIG. 9 shows a timing chart of the respective signals during the operation of the gate driving circuit 30 shown in FIG. 8. In FIG. 9, Q<1> and Q<2> represent the voltages of the pull-up node Q in the first stage shift register circuitry A1 and the second stage shift register circuitry A2 in the gate driving circuit 30, respectively. OUT<1>, OUT<2>, OUT<3>, and OUT<4> respectively represent the respective pixel signal output terminals OUT of the first stage shift register circuitry A1, the second stage shift register circuitry A2, the third stage shift register circuitry A3, and the fourth stage shift register circuitry A4 in the gate driving circuit 30. 1F, 2F, 3F, and 4F represent a first frame, a second frame, a third frame, and a fourth frame, respectively. Display indicates the display period in a frame, and Blank indicates the blanking period in a frame. It should be noted that, as the voltages of the shift signal output terminal CR and the pixel signal output terminal OUT in the shift register circuitry of each stage are the same, the shift signal output terminal CR may not be shown in FIG. 9.

It can be understood that the voltage of the signal in the signal timing diagram shown in FIG. 9 is only schematic and does not represent the actual voltage value. Further, in the example, the first voltage VGL1 is at a low level, the second voltage VDD is at a high level, and the third voltage VGL2 is at a low level.

The working process of the gate driving circuit 30 shown in FIG. 8 will be described below with reference to the signal timing diagram in FIG. 9. For example, the shift register circuitry in the gate driving circuit 30 shown in FIG. 8 may employ the structure of the shift register circuitry shown in FIG. 5 and FIG. 6.

Before the start of the first frame 1F, the fifth sub-clock signal line CLK_5 and the sixth sub-clock signal line CLK_6 both provide a high level signal. The second clock signal terminal CLKB and the third clock signal terminal CLKC in the respective shift register circuitries are alternately connected to the fifth sub-clock signal line CLK_5 and the sixth sub-clock signal line CLK_6, thus the third transistor M3 and the seventeenth transistor M17 are both turned on in the respective shift register circuitries. At this time, the blanking input signal terminal STU provides a low level signal. Therefore, the pull-up control node H and the pull-up node Q in the respective shift register circuitry can be reset, to implement a global reset. In this situation, the voltages of the pull-up control node H and the pull-up node Q are both at the low levels.

Then, the first frame 1F starts, the signal from the sixth sub-clock signal line CLK_6 becomes a low level, while the signal from the fifth sub-clock signal line CLK_5 remains a high level.

As the fifth voltage terminal VDD_B provides a high level signal, the thirteenth transistor M13 is turned on, such that the pull-down node QB is charged to a high level. The ninth transistor M9 is turned on via the high level voltage of the pull-down node QB, thereby pulling down the pull-up node Q to a low level.

In the display period (Display) of the first frame 1F, the working process of the first stage shift register circuitry A1 will be described as follows.

In a first phase 1, the blanking input signal terminal STU1 and the display input signal terminal STU2 of the first stage shift register circuitry A1 are both coupled to the input signal line STU. Thus, the high level signal is inputted to both the blanking input signal terminal STU1 and the display input signal terminal STU2. The sixth transistor M6 is turned on. The high-level signal of the second voltage terminal VDD can charge the pull-up node Q<1> via the sixth transistor M6, such that the voltage of the pull-up node Q is pulled up to a high level and is stored by the second capacitor C2. At the beginning, because the fifth sub-clock signal line CLK_5 is input with a high level signal, while the second clock signal terminal CLKB connected thereto is also at a high level, the third transistor M3 is turned on. Thus, the voltage of the pull-up control node H<1> is charged to a high level, and is stored by the first capacitor C1. The sixteenth transistor M16 is turned on due to the high level signal from the display input signal terminal STU2, such that the pull-down node QB can be pulled down additionally.

Then, the fifth sub-clock signal line CLK_5 provides a low level signal, such that the voltage of the second clock signal terminal CLKB is a low level. The third transistor M3 is turned off. As described above, the voltage of the pull-up node Q<1> is at a high level, such that the seventh transistor M7 and the eighth transistor M8 are turned on. As the first sub-clock signal line CLK_1 provides a low-level signal, the signal from the connected fourth clock signal terminal CLKD is at a low-level. Thus, both the shift signal output terminal CR and the pixel signal output terminal OUT output low-level signals.

When the pull-up node Q<1> is written in a high level voltage, the pull-down node QB can be pulled down to a low level by the fourteenth transistor M14, thereby turning off the tenth transistor M10 and the eleventh transistor M11. In this situation, the voltage of the display input signal terminal STU2 remains at a high level. The first transistor M1 is turned on. The shift signal output terminal CR is coupled to the pixel signal output terminal OUT. Noise reduction process can be performed on the voltage of the shift signal output terminal CR via the load capacitor CL and a load resistor RL coupled to the pixel signal output terminal OUT. Therefore, the voltage of the shift signal output terminal CR can be stabilized, and the noise of the shift signal output terminal CR can be effectively reduced.

In a second phase 2, a high-level signal is provided to the fourth clock signal terminal CLKD via the first sub-clock signal line CLK_1. The voltage of the pull-up node Q<1> is further pulled up due to the bootstrapping effect. The seventh transistor M7 and the eighth transistor M8 remain enabled. Both the shift signal output terminal CR and the pixel signal output terminal OUT output high-level signals. For example, the high-level signal from the shift signal output terminal CR can be configured for scanning shift of the upper to lower shift register circuitries. Moreover, the high-level signal from the pixel signal output terminal OUT can be configured to drive the sub-pixel units in the display panel.

In a third phase 3, a low-level signal is provided to the fourth clock signal terminal CLKD via the first sub-clock signal line CLK_1. Both the shift signal output terminal CR and the pixel signal output terminal OUT can be discharged via the fourth clock signal terminal CLKD, to implement the reset of the shift signal output terminal CR and the pixel signal output terminal OUT. Because the shift signal output terminal CR and the pixel signal output terminal OUT are reset to a low level, the voltage of the pull-up node Q<1> may be decreased by an amplitude by the coupling effect between the transistors. In addition, as the display reset signal terminal STD of the first stage shift register circuitry A1 is coupled to the shift signal output terminal CR of the fourth stage shift register circuitry, while the shift signal output terminal CR of the fourth stage shift register circuitry does not output the high level signal, the pull-up node Q<1> may not be pulled down. Therefore, the pull-up node Q<1> can be maintained at a high level.

In a fourth phase 4, the shift signal output terminal CR of the fourth stage shift register circuitry A4 outputs a high level signal. The display reset signal terminal STD of the first stage shift register circuitry A1 is also at a high level. The eighteen transistor M18 is turned on. The pull-up node Q<1> is pulled down to a low level, there by implementing the reset of the pull-up node Q<1>.

With the above process, the voltage of the pull-up node Q of the first stage shift register circuitry is in a "tower shape". When the voltages of the shift signal output terminal CR and the pixel signal output terminal OUT are at high levels, the voltage of the pull-up node Q raises to a high level due to the bootstrap effect. Therefore, when the signal of the shift signal output terminal CR and the pixel signal output terminal OUT are discharged via the seventh transistor M7 and the eighth transistor M8, respectively, more currents may flow through the transistors, while the discharging speed may become faster. In addition, because the charges accumulated at the shift signal output terminal CR and the pixel signal output terminal OUT can be discharged via the seventh transistor M7 and the eighth transistor M8, respectively, the eighth transistor M8 and the seventh transistor M7 may adopt the transistors with smaller sizes, to reduce the layout area of the shift register circuitry.

In the above-mentioned display period of the first frame, the first clock signal terminal CLKA (coupled to the seventh sub-clock signal line CLK_7) is held at a low level, thus the fifth transistor M5 is maintained to be turned off. The fifth transistor M5 may isolate the pull-up node Q in the display period from the pre-stored high level voltage of the pull-up control node H.

After the first-stage shift register circuitry drives the sub-pixels in the first row of the display panel to complete the display, in turns, the shift register circuitries at the second-stage, the third-stage, and the like, may drive the sub-pixel units in the display panel row by row, thereby implementing the display driving of the frame. Therefore, the display period of the first frame completes.

In addition, the display reset signal line STD can provide a display reset signal to the display reset signal terminals of the shift register circuitries at the last three stages during the display period of each frame. The corresponding eighteenth transistor M18 is turned on, thereby pulling down the pull-up Node Q.

In the blanking period (Blank) of the first frame 1F, the working process of the first-stage shift register circuitry A1 may be described as follows.

In a fifth phase 5, the pull-up control node H maintains the high level voltage in the display period due to the storage of the first capacitor C1. In this situation, the first clock signal terminal CLKA (coupled to the seventh sub-clock signal line CLK_7) and the third clock signal terminal CLKC (coupled to the sixth sub-clock signal line CLK_6) are provided with a high-level signal. The fourth transistor M4 and the five transistor M5 are turned on. Therefore, the pull-up node Q<1> can be charged via the high level voltage of the third clock signal terminal CLKC, and pulled up to a high level. The fourteenth transistor M14 is turned on under the control of the voltage of the pull-up node Q<1>, such that the pull-down node QB is pulled down to a low level. The fifteenth transistor M15 is also turned on under the control of the first clock signal terminal CLKA, and can further pull down the pull-down node QB.

In an embodiment, the first clock signal terminal CLKA provides a high level signal, thus the second transistor M2 is turned on. Therefore, the second transistor M2 can couple the shift signal output terminal CR to the pixel signal output terminal OUT. Then, a noise reduction process can be performed on the signal from the shift signal output terminal CR via the load capacitor CL and the load resistor RL coupled to the pixel signal output terminal OUT. Therefore, the voltage of the shift signal output terminal CR can be stabilized. The signal noise of the shift signal output terminal CR can be effectively reduced.

In a sixth phase 6, the first clock signal terminal CLKA provides a low-level signal, thus the fifth transistor M5 is turned off. The fourth clock signal terminal CLKD (coupled to the first sub-clock signal line CLK_1) is provided with a high-level signal. The voltage of the pull-up node Q<1> may be further pulled up due to the bootstrapping effect. The seventh transistor M7 and the eighth transistor M8 are turned on. The high-level signal from the fourth clock signal terminal CLKD can be provided to the shift signal output terminal CR and the pixel signal output terminal OUT.

In addition, the second clock signal terminal CLKB of the second stage shift register circuitry A2 is coupled to the sixth sub-clock signal line CLK_6, while the blanking input signal terminal STU1 of the second stage shift register circuitry A2 is coupled to the shift signal output terminal CR of the first stage shift register circuitry A1. The third transistor M3 in the second stage shift register circuitry A2 is turned on. The pull-up control node H<2> in the second stage shift register circuitry A2 is pulled up to a high level.

After the high level voltage is sufficiently written into the pull-up control node H<2> in the second-stage shift register circuitry, in a seventh phase 7, the sixth sub-clock signal line CLK_6 provides a low level signal. Moreover, the fourth clock signal terminal CLKD of the first stage shift register circuitry A1 (coupled to the first sub-clock signal line CLK_1) maintains to provide a high level signal. Therefore, the shift signal output terminal CR and the pixel signal output terminal OUT keep outputting high level voltages. In this process, the first clock signal terminal CLKA (coupled to the seventh sub-clock signal line CLK_7) is at a low level, such that the fifth transistor M5 is turned off. Therefore, the pull-up node Q<1> can be prevented from leaking via the fifth transistor M5.

In an eighth phase 8, the fifth sub-clock signal line CLK_5 provides a high level signal. The second clock signal terminal CLKB of the shift register circuitry at the odd-numbered stage is coupled to the fifth sub-clock signal line CLK_5, thus the pull-up control node H and the pull-up node Q in the respective shift register circuitries at the odd-numbered stages can be reset.

As shown in FIG. 9, in the display period Display of the second frame 2F, the gate driving circuit 30 performs the same operation as the display period of the first frame, which is not repeated here.

In the blanking period Blank of the second frame 2F, for the second stage shift register circuitry A2, the third clock signal terminal CLKC is coupled to the fifth sub-clock signal line CLK_5. At the beginning of the blanking period, the first clock signal terminal CLKA and the third clock signal terminal CLKC of the second stage shift register circuitry A2 are both provided with a high-level signal. The fourth transistor M4 and the fifth transistor M5 are turned on. The high level signal from the third clock signal terminal CLKC can charge the pull-up node Q<2>, such that the pull-up node Q<2> can be pulled up to a high level. Then, when a high-level signal is provided to the second sub-clock signal line CLK_2, the shift signal output terminal CR and the pixel signal output terminal OUT output respectively a high-level signal, while the pull-up control node H in the third stage shift register circuitry<3> can be charged. In the final phase of the blanking period of the second frame, the sixth sub-clock signal line CLK_6 provides a high level signal. As the second clock signal terminal CLKB of the shift register circuitry at the even-numbered stage is coupled to the sixth sub-clock signal line CLK_6, it may complete the reset of the pull-up control node H and the pull-up node Q of all the shift register circuitries at the even-numbered stages.

Then, the driving of the gate driving circuit in a third frame, a fourth frame, a fifth frame, and the like, can be performed with reference to the above description, and is not repeated here.

As described above, in the blanking period of each frame, the blanking output signal from the gate driving circuit can be configured to drive the sensing transistor in the sub-pixel unit in the display panel. As shown in FIG. 8, the driving signals are sequentially provided on a row-by-row basis. For example, during the blanking period of the first frame, the gate driving circuit outputs driving signals for the sub-pixel units in the first row of the display panel. During the blanking period of the second frame, the gate driving circuit outputs the driving signals for the sub-pixel units in the second row of the display panel, and so on, to implement the row-by-row sequential compensation.

On the other hand, embodiments of the present disclosure also provide a display device. The display device may include a gate driving circuit 30 according to an embodiment of the present disclosure. In the embodiment, the display device may be any liquid crystal panel, liquid crystal television, display, OLED panel, OLED television, electronic paper display device, mobile phone, tablet, notebook, digital frame, navigator and any other product or component having a display function.

In addition, embodiments of the present disclosure also provide a method for driving a shift register circuitry and a gate driving circuit.

Figure 10:
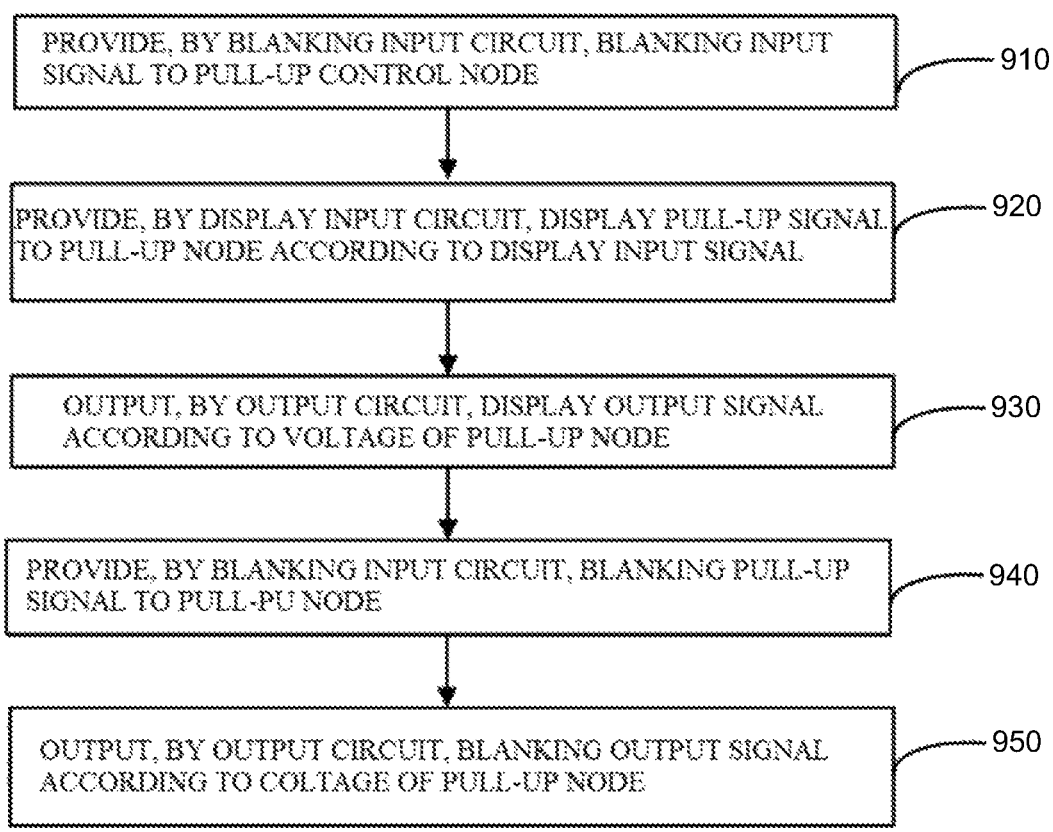
FIG. 10 illustrates a schematic flowchart of a method for driving a shift register circuitry according to an embodiment of the present disclosure.

FIG. 10 shows a schematic flowchart of a method for driving a shift register circuitry according to an embodiment of the present disclosure. The shift register circuitry may be any applicable shift register circuitry based on embodiments of the present disclosure, for example, at least one of the shift register circuitry 10, the shift register circuitry 15, the shift register circuitry 20, and the shift register circuitry 25.

As shown in FIG. 10, in the method, in step 910, the blanking input circuit 100 may provide the blanking input signal to the pull-up control node H in response to the second clock signal. In an embodiment, the blanking input circuit 100 may store the voltage of the pull-up control node H.

In step 920, the display input circuit 200 may provide the display pull-up signal to the pull-up node Q in response to the display input signal. Under the control of the display input signal, the first control circuit 400 can couple the shift signal output terminal CR to the pixel signal output terminal OUT. Therefore, the voltage noise of the shift signal output terminal CR can be reduced by the load capacitor CL and the load resistor RL coupled to the pixel signal output terminal OUT. Therefore, the voltage of the shift signal output CR can be stabilized, while the noise of the shift signal output terminal CR can be effectively reduced.

In step 930, the output circuit 300 may output the display output signal under the control of the voltage of the pull-up node Q. For example, the display output signal can be configured to drive the sub-pixel unit in the display panel for display.

In an embodiment, steps 920 and 930 may be performed during the display period of the frame.

In step 940, the blanking input circuit 100 may provide the blanking pull-up signal to the pull-up node Q under the control of the voltage of the pull-up control node H and the first clock signal.

In an embodiment, the second control circuit 420 may couple the shift signal output terminal CR to the pixel signal output terminal OUT under the control of the first clock signal. Therefore, the voltage noise of the shift signal output terminal CR can be reduced by the load capacitor CL and the load resistor RL coupled to the pixel signal output terminal OUT. Therefore, the voltage of the shift signal output terminal CR can be stabilized, and the noise of shift signal output terminal CR can be the effectively reduced.

In step 950, the output circuit 300 may output the blanking output signal under the control of the voltage of the pull-up node Q. For example, the blanking output signal can be configured to drive the sub-pixel unit in the display panel for external compensation.

In an embodiment, step 910 may be performed during the blanking period of a frame, and steps 940 and 950 may be performed during the blanking period of the next frame. Further, in other embodiments, for example, for the first stage shift register circuitry in the gate driving circuit, step 910 may be performed during the display period of a frame, and steps 940 and 950 may be performed during the blanking period of the same frame.

Those skilled in the art can understand that although the above steps are described in order, the present disclosure is not limited to the method order. The embodiments of the present disclosure may also be implemented in any other suitable order.

Several embodiments of the present disclosure have been described in detail above, but the scope of protection of the present disclosure is not limited thereto. It is apparent to those of ordinary skills in the art that various modifications, substitutions, or changes may be made to the embodiments of the present disclosure without departing from the spirit and scope of the present disclosure. The scope of protection of the present disclosure is defined by the appended claims.

What is claimed is:

1. A shift register circuitry comprising a blanking input circuit, a display input circuit, an output circuit, a first control circuit, a load capacitor and a load resistor,
    wherein the blanking input circuit is configured to provide a blanking input signal to a pull-up control node and to provide a blanking pull-up signal to a pull-up node;
    wherein the display input circuit is configured to provide a display pull-up signal to the pull-up node according to a display input signal;
    wherein the output circuit is configured to provide an output signal to a shift signal output terminal and a pixel signal output terminal according to a voltage of the pull-up node;
    wherein the first control circuit is configured to couple the shift signal output terminal to the pixel signal output terminal according to the display input signal;
    wherein an end of the load capacitor is coupled to the pixel signal output terminal, and the other end of the load capacitor is grounded; and
    wherein an end of the load resistor is coupled to the pixel signal output terminal, and the other end of the load resistor is grounded.

2. The shift register circuitry according to claim 1, wherein the first control circuit comprises a first transistor, and
    wherein a control electrode of the first transistor is coupled to a display input signal terminal to receive the display input signal, wherein a first electrode of the first transistor is coupled to the shift signal output terminal, and wherein a second electrode of the first transistor is coupled to the pixel signal output terminal.

3. The shift register circuitry according to claim 1, wherein the shift register circuitry further comprises a second control circuit, and wherein the second control circuit is configured to couple the shift signal output terminal to the pixel signal output terminal according to a first clock signal.

4. The shift register circuitry according to claim 1, further comprising a second control circuit, wherein the second control circuit comprises a second transistor, and
    wherein a control electrode of the second transistor is coupled to a first clock signal terminal to receive a first clock signal, wherein a first electrode of the second transistor is coupled to the shift signal output terminal, and wherein a second electrode of the second transistor is coupled to the pixel signal output terminal.

5. The shift register circuitry according to claim 1, wherein the blanking input circuit comprises:
a charging sub-circuit configured to provide the blanking input signal to the pull-up control node according to a second clock signal;
a storage sub-circuit configured to store the blanking input signal from the charging sub-circuit; and
an isolation sub-circuit configured to provide the blanking pull-up signal to the pull-up node according to a voltage of the pull-up control node and a first clock signal.

6. The shift register circuitry according to claim 5, wherein the charging sub-circuit comprises a third transistor, wherein a control electrode of the third transistor is coupled to a second clock signal terminal to receive the second clock signal, wherein a first electrode of the third transistor is coupled to a blanking input signal terminal to receive the blanking input signal, and wherein a second electrode of the third transistor is coupled to the pull-up control node;
wherein the storage sub-circuit comprises a first capacitor, wherein a first end of the first capacitor is coupled to the pull-up control node, and wherein a second end of the first capacitor is coupled to a first voltage terminal to receive a first voltage; and
wherein the isolation sub-circuit comprises a fourth transistor and a fifth transistor, wherein a control electrode of the fourth transistor is coupled to the pull-up control node, wherein a first electrode of the fourth transistor is coupled to a third clock signal terminal to receive a third clock signal as the blanking pull-up signal, wherein a second electrode of the fourth transistor is coupled to a first electrode of the fifth transistor, wherein a control electrode of the fifth transistor is coupled to a first clock signal terminal to receive the first clock signal, and wherein a second electrode of the fifth transistor is coupled to the pull-up node.

7. The shift register circuitry according to claim 1, wherein the display input circuit comprises a sixth transistor, and
wherein a control electrode of the sixth transistor is coupled to a display input signal terminal to receive the display input signal, wherein a first electrode of the sixth transistor is coupled to a second voltage terminal to receive a second voltage as the display pull-up signal, and wherein a second electrode of the sixth transistor is coupled to the pull-up node.

8. The shift register circuitry according to claim 1, wherein the output circuit comprises a seventh transistor, an eighth transistor, and a second capacitor,
wherein a control electrode of the seventh transistor is coupled to the pull-up node, wherein a first electrode of the seventh transistor is coupled to a fourth clock signal terminal to receive a fourth clock signal as the output signal, and wherein a second electrode of the seventh transistor is coupled to the shift signal output terminal;
wherein a control electrode of the eighth transistor is coupled to the pull-up node, wherein a first electrode of the eighth transistor is coupled to the fourth clock signal terminal to receive the fourth clock signal as the output signal, and wherein a second electrode of the eighth transistor is coupled to the pixel signal output terminal; and wherein a first end of the second capacitor is coupled to the pull-up node, and wherein a second end of the second capacitor is coupled to the second electrode of the seventh transistor.

9. The shift register circuitry according to claim 1, further comprising a pull-down circuit, a first pull-down control circuit, a second pull-down control circuit, and a reset circuit,
wherein the pull-down circuit is configured to perform noise reduction on the pull-up node, the shift signal output terminal, and the pixel signal output terminal according to a voltage of a pull-down node;
wherein the first pull-down control circuit is configured to control the voltage of the pull-down node according to the voltage of the pull-up node;
wherein the second pull-down control circuit is configured to control the voltage of the pull-down node according to a blanking pull-down control signal and a display pull-down control signal; and
wherein the reset circuit is configured to reset the voltage of the pull-up node according to a blanking reset signal and a display reset signal.

10. The shift register circuitry according to claim 9, wherein the pull-down circuit comprises a ninth transistor, a tenth transistor, and an eleventh transistor;
wherein a control electrode of the ninth transistor is coupled to the pull-down node, wherein a first electrode of the ninth transistor is coupled to the pull-up node, and wherein a second electrode of the ninth transistor is coupled to a first voltage terminal to receive a first voltage;
wherein a control electrode of the tenth transistor is coupled to the pull-down node, wherein a first electrode of the tenth transistor is coupled to the shift signal output terminal, and wherein a second electrode of the tenth transistor is coupled to the first voltage terminal to receive the first voltage; and
wherein a control electrode of the eleventh transistor is coupled to the pull-down node, wherein a first electrode of the eleventh transistor is coupled to the pixel signal output terminal, and wherein a second electrode of the eleventh transistor is coupled to a third voltage terminal to receive a third voltage.

11. The shift register circuitry according to claim 9, wherein the first pull-down control circuit comprises a twelfth transistor, a thirteenth transistor, and a fourteenth transistor;
wherein a control electrode and a first electrode of the twelfth transistor are coupled to a fourth voltage terminal to receive a fourth voltage, and wherein a second electrode of the twelfth transistor is coupled to the pull-down node;
wherein a control electrode and a first electrode of the thirteenth transistor are coupled to a fifth voltage terminal to receive a fifth voltage, and wherein a second electrode of the thirteenth transistor is coupled to the pull-down node; and
wherein a control electrode of the fourteenth transistor is coupled to the pull-up node, wherein a first electrode of the fourteenth transistor is coupled to the pull-down node, and wherein a second electrode of the fourteenth transistor is coupled to a first voltage terminal to receive a first voltage.

12. The shift register circuitry according to claim 9, wherein the second pull-down control circuit comprises a fifteenth transistor and a sixteenth transistor;

wherein a control electrode of the fifteenth transistor is coupled to a first clock signal terminal to receive a first clock signal as the blanking pull-down control signal, wherein a first electrode of the fifteenth transistor is coupled to the pull-down node, and wherein a second electrode of the fifteenth transistor is coupled to a first voltage terminal to receive a first voltage; and wherein a control electrode of the sixteenth transistor is coupled to a display input signal terminal to receive the display input signal as the display pull-down control signal, wherein a first electrode of the sixteenth transistor is coupled to the pull-down node, and wherein a second electrode of the sixteenth transistor is coupled to the first voltage terminal to receive the first voltage.

13. The shift register circuitry according to claim 9, wherein the reset circuit comprises a seventeenth transistor and an eighteenth transistor;

wherein a control electrode of the seventeenth transistor is coupled to a second clock signal terminal to receive a second clock signal as the blanking reset signal, wherein a first electrode of the seventeenth transistor is coupled to the pull-up node, and wherein a second electrode of the seventeenth transistor is coupled to a first voltage terminal to receive the first voltage, and wherein a control electrode of the eighteenth transistor is coupled to a display reset signal terminal to receive the display reset signal, wherein a first electrode of the eighteenth transistor is coupled to the pull-up node, and wherein a second electrode of the eighteenth transistor is coupled to the first voltage terminal to receive the first voltage.

14. A gate driving circuit comprising a plurality of cascaded shift register circuitries according to claim 1, wherein a shift signal output terminal of the shift register circuitry at an $n^{th}$ stage provides a blanking input signal to the shift register circuitry at an $(n+1)^{th}$ stage;

wherein a shift signal output terminal of the shift register circuitry at the $n^{th}$ stage provides a display input signal to the shift register circuitry at an $(n+2)^{th}$ stage; and wherein n is an integer greater than 0.

15. The gate driving circuit according to claim 14, further comprising a first sub-clock signal line, a second sub-clock signal line, a third sub-clock signal line, and a fourth sub-clock signal line, wherein the first sub-clock signal line provides a fourth clock signal to the shift register circuitry at a $(4i-3)^{th}$ stage as an output signal;

wherein the second sub-clock signal line provides a fourth clock signal to the shift register circuitry at a $(4i-2)^{th}$ stage as an output signal;

wherein the third sub-clock signal line provides a fourth clock signal to the shift register circuitry at a $(4i-1)^{th}$ stage as an output signal; and wherein the fourth sub-clock signal line provides a fourth clock signal to the shift register circuitry at a $4i^{th}$ stage as an output signal.

16. The gate driving circuit according to claim 15, further comprising a fifth sub-clock signal line, a sixth sub-clock signal line, and a seventh sub-clock signal line;

wherein the fifth sub-clock signal line provides a second clock signal to the shift register circuitry at a $(2n-1)^{th}$ stage and provides a third clock signal to the shift register circuitry at a $2n^{th}$ stage, as a blanking pull-up signal;

wherein the sixth sub-clock signal line provides a third clock signal to the shift register circuitry at the $(2n-1)^{th}$ stage as a blanking pull-up signal, and provides a second clock signal to the shift register circuitry at the $2n^{th}$ stage; and wherein the seventh sub-clock signal line provides a first clock signal to the respective shift register circuitries.

17. The gate driving circuit according to claim 14, wherein the shift signal output terminal of the shift register circuitry at an $(n+3)^{th}$ provides a display reset signal to the shift register circuitry at the $n^{th}$ stage.

18. A method for driving a shift register circuitry according to claim 1, the method comprising:

providing, by a blanking input circuit, a blanking input signal to a pull-up control node;

providing, by a display input circuit, a display pull-up signal to a pull-up node according to the display input signal, wherein a shift signal output terminal is coupled to a pixel signal output terminal by a first control circuit according to the display input signal;

outputting, by an output circuit, a display output signal according to a voltage of the pull-up node;

providing, by a blanking input circuit, a blanking pull-up signal to the pull-up node according to the voltage of the pull-up control node and a first clock signal; and outputting, by the output circuit, a blanking output signal according to the voltage of the pull-up node.

19. The method according to claim 18, wherein the shift register circuitry further comprises a second control circuit configured to couple the shift signal output terminal to the pixel signal output terminal according to the first clock signal, wherein the method further comprises:

coupling, by the second control circuit, the shift signal output terminal to the pixel signal output terminal according to the first clock signal.

* * * * *